US012488910B2

(12) United States Patent
Abe et al.

(10) Patent No.: US 12,488,910 B2
(45) Date of Patent: Dec. 2, 2025

(54) CONDUCTIVE FILM, OPTOELECTRONIC DEVICE AND CONDUCTIVE FILM MANUFACTURING METHOD

(71) Applicant: AGC Inc., Tokyo (JP)

(72) Inventors: Takefumi Abe, Tokyo (JP); Kaori Tsuruoka, Tokyo (JP)

(73) Assignee: AGC Inc., Tokyo (JP)

( * ) Notice: Subject to any disclaimer, the term of this patent is extended or adjusted under 35 U.S.C. 154(b) by 225 days.

(21) Appl. No.: 17/934,753

(22) Filed: Sep. 23, 2022

(65) Prior Publication Data

US 2023/0022628 A1 Jan. 26, 2023

Related U.S. Application Data

(63) Continuation of application No. PCT/JP2021/023632, filed on Jun. 22, 2021.

(30) Foreign Application Priority Data

Jun. 30, 2020 (JP) ................................ 2020-112962

(51) Int. Cl.
*H01B 3/44* (2006.01)
*H01B 17/62* (2006.01)
(Continued)

(52) U.S. Cl.
CPC ............ *H01B 3/445* (2013.01); *H01B 17/62* (2013.01); *H10K 50/826* (2023.02); (Continued)

(58) Field of Classification Search
CPC ................................ H01B 3/445; H01B 17/62
(Continued)

(56) References Cited

U.S. PATENT DOCUMENTS 10,270,033 B2 4/2019 Chang et al.
2004/0197489 A1* 10/2004 Heuser .................. C23C 14/22 427/535

(Continued)

FOREIGN PATENT DOCUMENTS

JP 2015-10209 A 1/2015
JP 2018-533183 A 11/2018

OTHER PUBLICATIONS

International Search Report issued Jul. 27, 2021 in PCT/JP2021/023632 filed on Jun. 22, 2021, therein 3 pages.

(Continued)

*Primary Examiner* — Betelhem Shewareged
(74) *Attorney, Agent, or Firm* — Oblon, McClelland, Maier & Neustadt, L.L.P.

(57) ABSTRACT

To provide a novel conductive film having two regions differing in the light transmittance, an optoelectronic device having such a conductive film, and a method for producing a conductive film by which such a conductive film can readily be produced.

A conductive film, which has a first region and a second region having a light transmittance higher than the first region, the conductive film having a first film formed of a conductive material as a material and a resin film formed of a fluorinated polymer as a material, the first film being disposed to overlap with at least the first region among the first region and the second region, the resin film being disposed to overlap with the second region, and the fluorinated polymer satisfying the following (1) and (2):

(1) when the temperature is increased at a temperature-increasing rate of 2° C./min under a pressure of $1\times10^{-3}$ (Continued)

Pa, the temperature at which the thermogravimetric loss rate substantially reaches 100% is 400° C. or lower;

(2) when the temperature is increased at a temperature-increasing rate of 2° C./min under a pressure of $1\times10^{-3}$ Pa, the temperature width from a temperature at which the thermogravimetric loss rate is 10% to a temperature at which it is 90%, is within 200° C.

19 Claims, 6 Drawing Sheets

(51) Int. Cl.
*H10K 50/826* (2023.01)
*H10K 50/852* (2023.01)
*H10K 50/10* (2023.01)
*H10K 50/828* (2023.01)

(52) U.S. Cl.
CPC .......... *H10K 50/852* (2023.02); *H10K 50/10* (2023.02); *H10K 50/828* (2023.02)

(58) Field of Classification Search
USPC ........................................................ 428/195.1
See application file for complete search history.

(56) References Cited

U.S. PATENT DOCUMENTS

2015/0004419 A1 † 1/2015 Yamane
2018/0226581 A1 * 8/2018 Chang .................. H10K 50/824
2023/0022628 A1 * 1/2023 Abe ........................ H01L 31/10

OTHER PUBLICATIONS

Varagnolo, S. et al. "Selective deposition of silver and copper films by condensation coefficient modulation" Materials Horizons. Royal Society of Chemistry 2019. 6 pages.

* cited by examiner
† cited by third party

| | Ex. 22 | Ex. 23 | Ex. 24 |
|---|---|---|---|
| Microscopic image |  |  |  |
| Measured value (µm) | 27 | 28 | 27 |

CONDUCTIVE FILM, OPTOELECTRONIC DEVICE AND CONDUCTIVE FILM MANUFACTURING METHOD

TECHNICAL FIELD

The present invention relates to a conductive film, an optoelectronic device and a method for producing a conductive film.

BACKGROUND ART

In various optoelectronic devices, light transparency which influences writing and reading of optical information is a very important factor. A principal factor which impairs the light transmission is low light transparency of a conductive film used as the electrode.

In general, in order that an optoelectronic device stably operates, it is necessary to keep wire resistance of an electrode to a certain level or less. With reference to a display panel as an example, as the panel size increases, drawbacks occur such that IR drop is likely to occur and voltage distribution in a panel plane occurs, and thus a countermeasure is required, such as increase of the thickness of the electrode to keep the sheet resistance of the electrode low.

But on the other hand, such a countermeasure creates a conflict such that the thicker the electrode becomes, the more the light transparency decreases, and the more the light transparency of the optoelectronic device is impaired.

To overcome such problems, a conductive film having two regions differing in the light transmittance has been known. In the following explanation, with respect to the two regions differing in the light transmittance, a region with a relatively low light transmittance may sometimes be referred to as a "first region", and a region with a relatively high light transmittance as a "second region". Such a conductive film is used for, for example, an organic electroluminescence element (hereinafter referred to as an organic EL element), an optoelectronic conversion device, etc.

As a method for producing such a conductive film, a method of preliminary forming a patterned film by a material which suppresses formation of a metal film, and then forming a metal film to overlap with the patterned film e.g. by deposition or sputtering, has been known (for example, Patent Document 1, Non-Patent Document 1).

Specifically, Patent Document 1 discloses as the "material which suppresses formation of a metal film", organic semiconductor materials such as polycyclic aromatic compounds and polytetrafluoroethylene (PTFE).

Further, in the method disclosed by Non-Patent Document 1, as the "material which suppresses formation of a metal film", a solution of a fluorinated compound is used, and a pattern is formed by printing process.

By such a method, a metal film is formed so as to avoid the preliminarily formed patterned film. As a result, at a region in which a patterned film is formed by the material which suppresses formation of a metal film, a second region with a high light transmittance is formed. Further, at a region in which no patterned film is formed, a metal film is formed in a large amount to form a first region with a relatively low light transmittance, whereby a conductive film having the respective regions formed is obtained.

PRIOR ART DOCUMENTS

Patent Documents

Patent Document 1: U.S. patent Ser. No. 10/270,033
Non-Patent Document 1: Materials Horizons, 2020, 7, 143-148

DISCLOSURE OF INVENTION

Technical Problem

However, the above method has the following problems.

First, the organic semiconductor material used in the method disclosed in Patent Document 1 is insufficient in the effect of suppressing formation of the metal film, and the effect still should be improved. Further, a known PTFE as disclosed in Patent Document 1 is easily depolymerized or thermally decomposed at the time of deposition, and can hardly be used for stable pattern formation. Further, if an out gas or a partially decomposed product generated by depolymerization or thermal decomposition remains in the conductive film, the performance or the life of an organic device having such a conductive film may be deteriorated.

Further, by the method disclosed in Non-Patent Document 1 in which a solution of the fluorinated compound is applied, the solvent tends to deteriorate the constitution of the printed portion and to deteriorate the element performance.

Under these circumstances, the object of the present invention is to provide a novel conductive film having two regions differing in the light transmittance. Another object is to provide an optoelectronic device comprising such a conductive film. Still another object is to provide a method for producing a conductive film by which such a conductive film can readily be produced.

Solution to Problem

To achieve the above objects, the present invention provides the following.

[1] A conductive film, which has a first region and a second region having a light transmittance higher than the first region, the conductive film having a first film formed of a conductive material as a material and a resin film formed of a fluorinated polymer as a material, the first film being disposed to overlap with at least the first region among the first region and the second region, the resin film being disposed to overlap with the second region, and the fluorinated polymer satisfying the following (1) and (2):

(1) when the temperature is increased at a temperature-increasing rate of 2° C./min under a pressure of $1\times10^{-3}$ Pa, the temperature at which the thermogravimetric loss rate substantially reaches 100% is 400° C. or lower, (2) when the temperature is increased at a temperature-increasing rate of 2° C./min under a pressure of $1\times10^{-3}$ Pa, the temperature width from a temperature at which the thermogravimetric loss rate is 10% to a temperature at which it is 90%, is within 200° C.

[2] The conductive film according to [1], which has a second film formed of a conductive material as a material, extending from the first region to the second region, wherein the second film has a light transmittance higher than the first film at a position overlapping with the first region, and the second film is in contact with the first film at the first region.

[3] The conductive film according to [1] or [2], wherein the resin film has a surface energy of 30 mN/m or less.

[4] The conductive film according to any one of [1] to [3], wherein the fluorinated polymer has a melting point of 300° C. or lower.

[5] The conductive film according to any one of [1] to [3], wherein the fluorinated polymer is amorphous.

[6] The conductive film according to any one of [1] to [5], wherein the fluorinated polymer has a trifluoromethyl moiety, and the content of the trifluoromethyl moiety in the fluorinated polymer is 0.1 mmol/g or more.

[7] The conductive film according to any one of [1] to [6], wherein the fluorinated polymer has units derived from a fluoroolefin.

[8] The conductive film according to [7], wherein the fluorinated polymer has at least units derived from tetrafluoroethylene and units derived from a perfluoroalkyl vinyl ether.

[9] The conductive film according to any one of [1] to [8], wherein the fluorinated polymer has an alicyclic structure in its main chain.

[10] An optoelectronic device, comprising the conductive film as defined in any one of [1] to [9].

[11] The optoelectronic device according to [10], which comprises a substrate, an anode formed on the substrate, a cathode facing the anode, and an active layer disposed between the anode and the cathode, wherein the cathode is the conductive film.

[12] A method for producing a conductive film, which comprises a step of depositing a fluorinated polymer which satisfies the following (1) and (2) through a mask to form a resin film formed of the fluorinated polymer as a material, and a step of applying the conductive material from above the resin film by dry coating:

(1) when the temperature is increased at a temperature-increasing rate of 2° C./min under a pressure of $1\times10^{-3}$ Pa, the temperature at which the thermogravimetric loss rate substantially reaches 100% is 400° C. or lower, (2) when the temperature is increased at a temperature-increasing rate of 2° C./min under a pressure of $1\times10^{-3}$ Pa, the temperature width from a temperature at which the thermogravimetric loss rate is 10% to a temperature at which it is 90%, is within 200° C.

[13] The method for producing a conductive film according to [12], which has a step of removing the resin film after the dry coating step.

[14] The method for producing a conductive film according to [12] or [13], which has a step of forming a film of the conductive material on the surface of the substrate prior to the step of forming the resin film.

Advantageous Effects of Invention

According to the present invention, a novel conductive film having two regions differing in the light transmittance can be provided. An optoelectronic device comprising such a conductive film can also be provided. Further, a method for producing a conductive film by which such a conductive film can readily be produced, can be provided.

DESCRIPTION OF EMBODIMENTS

Figure 1:
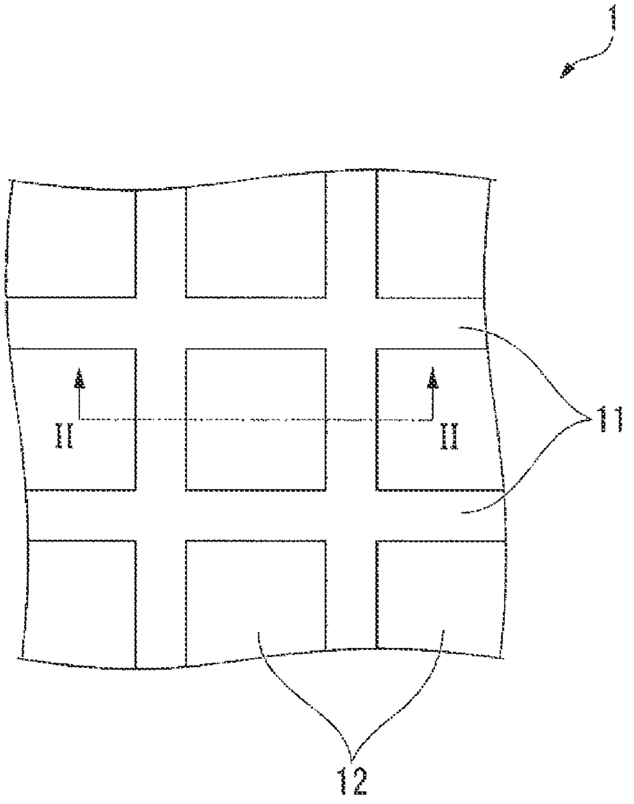
FIG. 1 is a plan view illustrating a conductive film 1.

A "unit" constituting a polymer in this specification means a moiety present in the polymer to constitute the polymer, derived from one molecule of a monomer (that is a monomer unit). Hereinafter, a unit derived from each monomer may sometimes be represented as the monomer name followed by "unit".

In this specification, the "main chain" of a polymer means a carbon atom chain constituted by addition polymerization of a monomer having a carbon-carbon unsaturated double bond, constituted by the two carbon atoms which had constituted the carbon-carbon unsaturated double bond in the monomer.

A "reactive functional group" means a group having reactivity capable of reacting intermolecularly in the fluorinated polymer or with other component blended with the fluorinated polymer (excluding radial reaction) to form a bond, e.g. when heated.

In this specification, an "aliphatic ring" means not only a carbocyclic ring having the cyclic skeleton constituted solely of carbon atoms but also a heterocyclic ring having the cyclic skeleton containing an atom (hetero atom) other than carbon atoms. The hetero atom may, for example, be an oxygen atom, a nitrogen atom or a sulfur atom.

First Embodiment

Now, the conductive film and the method for producing the conductive film according to a first embodiment of the present invention will be described with reference to FIGS. 1 to 8. In the drawings, for visibility, the dimensions, the ratios, etc. of the constituting elements are properly changed.

Figure 2:
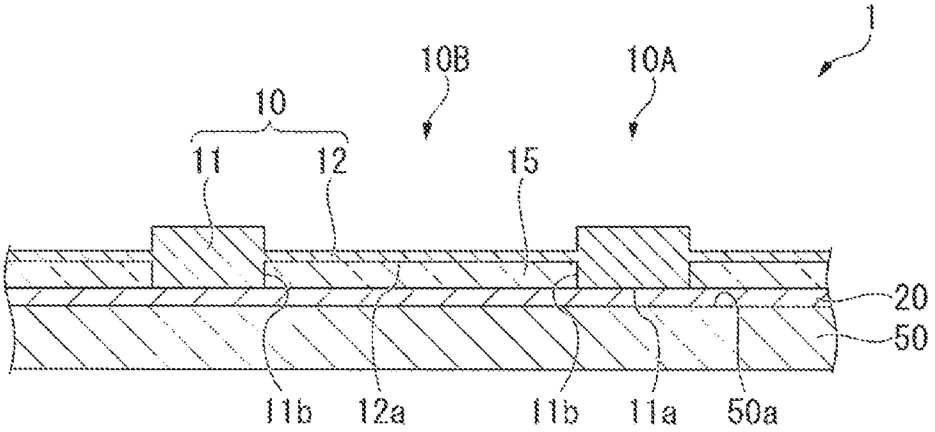
FIG. 2 is a cross-sectional arrow view at segment II-II in FIG. 1.

FIGS. 1 and 2 are views illustrating the conductive film 1 according to the present embodiment. FIG. 1 is a plan view illustrating a conductive film 1, and FIG. 2 is a cross-sectional arrow view at segment II-II in FIG. 1.

As shown in FIGS. 1 and 2, the conductive film 1 according to the present embodiment has a first film 10, a resin film 15 and a second film 20.

The conductive film 1 according to the present embodiment is provided on a substrate 50. The substrate 50 is an object on which the conductive film 1 is to be formed. The substrate 50 has light transparency.

The second film 20 is provided on the substrate 50, and the first film 10 is provided on the second film 20. The resin film 15 is provided between the first film 10 and the second film 20.

(First Film)

The first film 10 is a film formed of a conductive material. The conductive material as a material of the first film 10 is not particularly limited so long as it is a material having conductivity, and preferably contains silver (Ag), gold (Au), copper (Cu), aluminum (Al), magnesium (Mg), zinc (Zn), indium (In), tin (Sn), ytterbium (Yb) or the like. Specifically, a metal such as silver (Ag), gold (Au), copper (Cu), aluminum (Al), magnesium (Mg), magnesium silver (MgAg) or ytterbium silver (YbAg), or a conductive metal oxide such as indium tin oxide (ITO), indium zinc oxide (IZO) or zinc oxide (ZnO) may be mentioned.

The first film 10 has a first region 10A and a second region 10B having a light transmittance higher than the first region 10A. In the conductive film 1 according to the present embodiment, at the first region 10A, a thick film portion 11 of the first film (hereinafter referred to simply as the thick film portion 11) is located, and in the second region 10B, a thin film portion 12 of the first film (hereinafter referred to simply as the thin film portion 12) is located. The thick film portion 11 and the thin film portion 12 unitedly constitute the first film 10.

As shown in FIG. 1, in the conductive film 1, a plurality of the second regions 10B, that is a plurality of the thin portions 12 are arranged in a matrix, and on the other portion, the first region 10A formed in a lattice form, that is the thick film portion 11 in a lattice form, is formed. In FIG. 1, the second region 10B is rectangular in a plan view, however, the form is not limited thereto, and various plan-viewed shapes depending upon the design may be employed.

The lower surface 11*a* of the thick film portion 11 is in contact with the second film 20. Further, the side surface 11*b* of the thick film portion 11 is in contact with the resin film 15.

The lower surface 12*a* of the thin film portion 12 is in contact with the resin film 15.

The thin film portion 12 is thinner than the thick film portion 11. For example, the film thickness of the thick film portion 11 is from 10 nm to 10,000 nm, and the film thickness of the thin film portion 12 is from 0 nm to 50 nm. A thick film portion 11 formed to be so thin as 50 nm or less, has light transparency.

The thick film portion 11 is formed to be thicker than the thin film portion 12, so as to secure the conductivity of the entire conductive film 1. The thick film portion 11 may have light transparency or may not have light transparency so long as the required conductivity is secured.

(Second Film)

The conductive film according to the present embodiment may or may not have a second film 20 (a conductive film having no second film will be described later as a conductive film 3).

When the conductive film according to the present embodiment has a second film 20, the second film 20 is formed on the surface 50*a* of the substrate 50. The second film 20 is a film formed of a conductive material. The conductive material as a material of the second film 20 may be the same materials as the conductive material which can be used as the material of the first film 10.

The conductive material as a material of the first film 10 and the conductive material as a material of the second film 20 may be the same or different.

The second film 20 has light transparency. The second film 20 has a light transmittance higher than the thick film portion 11. The film thickness of the second film 20 is from 0 nm to 200 nm, more preferably from 0 nm to 100 nm, further preferably from 0 nm to 60 nm.

Further, the second film 20 two-dimensionally overlaps with the thin film portion 12. Accordingly, the film thickness of the second film 20 and the total film thickness of the second film 20 and the thin film portion 12 are properly adjusted so that the second region 10B has light transparency.

It is possible to use only the second film 20 as a transparent electrode to be used for an optoelectronic device such as a light-emitting element or a light-receiving element. Whereas, the second film 20 formed so thin as having light transparency has high wire resistance.

Whereas, the conductive film 1 according to the present embodiment has the second film 20 and the first film 10 laminated. Accordingly, at a position corresponding to the first region 10A, the thick film portion 11 and the second film 20 are laminated to be thick. Thus, the conductive film 1 as a whole has low resistance while light transparency is secured at a portion corresponding to the second region 10B.

(Resin Film)

The resin film 15 is formed of a fluorinated polymer as a material. The resin film 15 is disposed to overlap with the second region 10B. The resin film 15 is used, as described in the after-described method for producing a conductive film, to conduct pattering of the first region 10A and the second region 10B of the first film 10.

The fluorinated polymer as a material of the resin film 15 has low absorbance and has a low refractive index and thereby has small light absorption within a wavelength range including a near infrared region and is excellent in optical properties. Accordingly, the resin film 15 will not impair light transparency of the second region 10B even though it overlaps with the second region 10B having light transparency.

The fluorinated polymer as a material of the resin film 15 satisfies the following requirements (1) and (2).

(1) When the temperature is increased at a temperature-increasing rate of 2° C./min under a pressure of $1\times10^{-3}$ Pa, the temperature at which the thermogravimetric loss rate substantially reaches 100% is 400° C. or lower.

(2) When the temperature is increased at a temperature-increasing rate of 2° C./min under a pressure of $1\times10^{-3}$ Pa, the temperature width from a temperature at which the thermogravimetric loss rate is 10% to a temperature at which it is 90%, is within 200° C.

The fluorinated polymer which satisfies the requirements (1) and (2) has physical properties suitable for the after-described production method. Accordingly, by using the fluorinated polymer which satisfies the requirements (1) and (2), a conductive film 1 can be suitably produced.

Now, the method for producing a conductive film according to the present embodiment will be described, and then the resin film 15 and the fluorinated polymer as a material of the resin film 15 will be described.

(Method for Producing Conductive Film)

Figure 3:
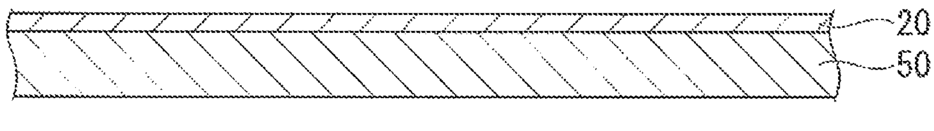
FIG. 3 is a schematic view illustrating a method for producing the conductive film 1.
Figure 4:
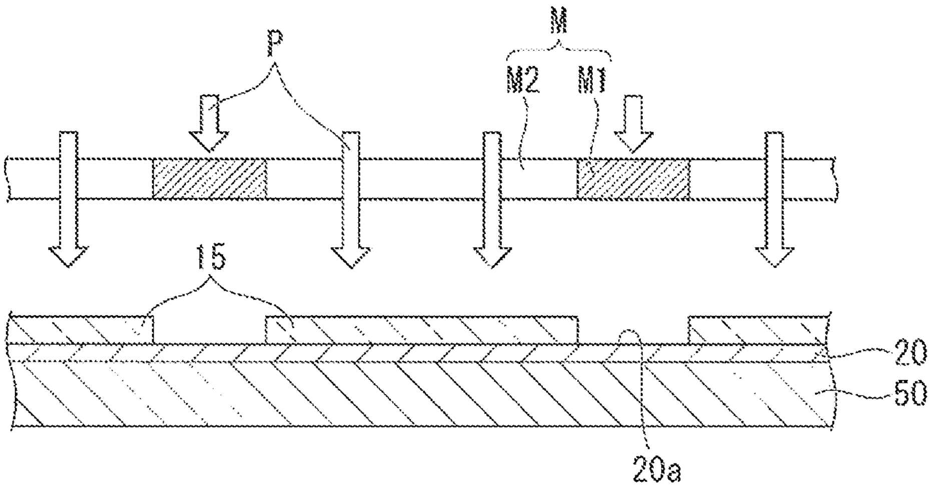
FIG. 4 is a schematic view illustrating a method for producing the conductive film 1.
Figure 5:
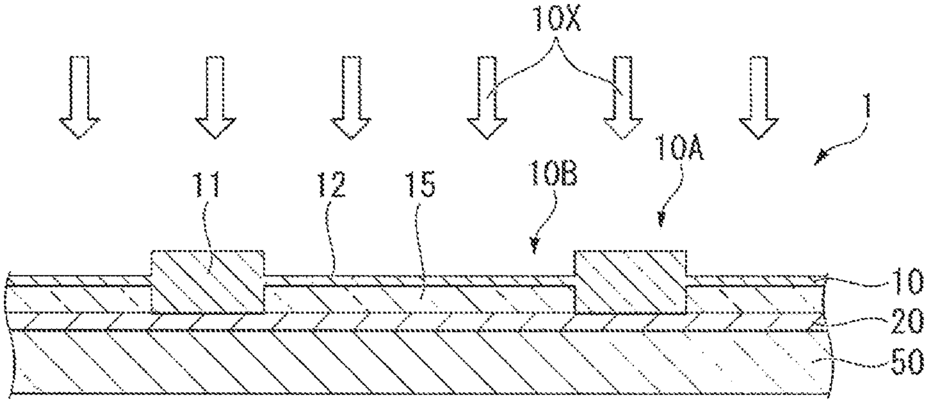
FIG. 5 is a schematic view illustrating a method for producing the conductive film 1.

FIGS. 3 to 5 are schematic views illustrating a method for producing the above-described conductive film 1.

First, as shown in FIG. 3, a film of the conductive material is formed on the surface of the substrate 50 to obtain a second film 20. The second film 20 may be formed, for example, by dry coating method such as deposition, sputtering, CVD (chemical vapor deposition) or ALD (atomic layer deposition). The second film 20 corresponds to the "primary layer" in the present invention.

Then, as shown in FIG. 4, on the surface 20*a* of the second film 20, a fluorinated polymer P which satisfies the requirements (1) and (2) is deposited via a mask M under reduced pressure. The mask M has openings M2 arranged in a matrix and a shielding portion M1 in a lattice form.

Deposition of the fluorinated polymer P is conducted, for example, by heating the fluorinated polymer under a pressure of $1\times10^{-3}$ Pa.

The fluorinated polymer P reaches the surface 20*a* of the second film 20 through the openings M2 of the mask M and is shielded by the shielding portion M1 of the mask M, whereby a resin film 15 formed of the fluorinated polymer P as a material is formed. The resin film 15 is arranged in a matrix on the surface 20*a*. Further, at a portion where no resin film 15 is formed, the second film 20 is exposed in a lattice form.

Then, as shown in FIG. 5, over the resin film 15, the above-described conductive material 10X is applied by dry coating. As dry coating, deposition, sputtering or ALD (atomic layer deposition) may, for example, be employed.

The conductive material 10X is less likely to be attached to the surface of the resin film 15 formed of the fluorinated polymer as a material, and is likely to be attached to the surface of the second film 20 formed of the conductive material as a material. Accordingly, by applying the conductive material 10X by dry coating over the entire surface from above the substrate 50 without using a mask, a film of the conductive material 10X is formed relatively thick on the surface of the second film 20, and a film of the conductive material 10X is formed relatively thin on the surface of the resin film 15.

In such a manner, on the surface of the second film 20, a thick film portion 11 in a lattice form is formed. Further, at a position corresponding to the resin film 15, a thin film portion 12 is formed in a matrix. The thick film portion 11 and the thin film portion 12 constitute the first film 10.

In such a manner, the conductive film 1 is obtained. The position where the thick film portion 11 is formed corresponds to the first region 10A. The position where the thin film portion 12 is formed corresponds to the second region 10B.

If the thick film portion 11 is to be directly produced by deposition via a mask, it is necessary to use a mask having a shielding portion in a matrix. Such a mask is required to have a holding portion to hold the shielding portion, and at a portion shielded by the holding portion, the thick film portion 11 will not be formed, and the film thickness of the obtainable thick film portion 11 tends to be non-uniform. Otherwise, formation of the thick film portion 11 in a lattice form by conducting deposition dividedly several times using a stripe mask may be considered, however, positioning of the mask tends to be difficult, and operation tends to be troublesome.

Further, in a case where the mask is formed of a metal, when the thick film portion 11 is to be produced by deposition, the conductive material 10X to be deposited will be gradually attached to the metal mask, thus changing the sizes of the openings of the mask. In such a case, the conductive material 10X attached to the metal mask should be cleaned off or the mask should be changed to a new one, and troublesome work and a tremendous cost will be required.

On the other hand, in the above production method, as shown in FIG. 5, the resin film 15 is formed of the fluorinated polymer P as a material, and on the entire resin film 15, the conductive material 10X is deposited, whereby a first film 10 having the thick film portion 11 and the thin film portion 12 naturally patterned is obtained. The resin film 15 can be precisely formed by deposition via a mask. Thus, according to the method for producing a conductive film, a precisely patterned conductive film can readily be produced.

(Fluorinated Polymer)

Now, the fluorinated polymer will be described below.

(Requirement (1))

The fluorinated polymer used in the production method satisfies the requirement (1).

(1) When the temperature is increased at a temperature-increasing rate of 2° C./min under a pressure of $1\times10^{-3}$ Pa, the temperature at which the thermogravimetric loss rate substantially reaches 100% is 400° C. or lower.

In the present embodiment, as the thermogravimetric loss rate, a value measured by using a vacuum differential thermobalance (manufactured by ADVANCE RIKO, Inc., VPE-9000) is employed. Specifically, 50 mg of the fluorinated polymer is put in a cell having an inner diameter of 7 mm, and the weight loss rate (%) of the fluorinated polymer when the temperature is increased from room temperature to 500° C. at a rate of 2° C. per minute in a degree of vacuum of $1\times10^{-3}$ Pa, to the initial weight (50 mg), is measured.

In the requirement (1), "substantially" means that when the thermogravimetric loss rate is measured under the above conditions, the thermogravimetric loss in a temperature range of 400° C. or lower is lower than the detection lower limit and the thermogravimetric loss can not be confirmed.

The fluorinated polymer according to the present embodiment may be considered to have a lower molecular weight (degree of polymerization) as the temperature which satisfies the requirement (1) is lower.

If a fluorinated polymer which does not satisfy the requirement (1) is to be deposited, it has to be heated to a temperature higher than 400° C. If the fluorinated polymer is heated in a temperature range higher than 400° C., the fluorinated polymer may be depolymerized or thermally decomposed due to high temperature. In such a case, products formed by depolymerization or thermal decomposition may increase the internal pressure of a vacuum chamber used for deposition. If the internal pressure of a vacuum chamber is increased, the deposition conditions tend to be unstable, and the quality of the obtainable deposited film (resin film) may not be stable.

Further, if a fluorinated polymer which does not satisfy the requirement (1) is heated in a temperature range higher than 400° C., a fluorinated polymer partially depolymerized or thermally decomposed and thus having a low molecular weight may be included in the resin film, thus lowering the heat resistance of the resin film.

Further, if a fluorinated polymer which does not satisfy the requirement (1) is heated in a temperature range higher than 400° C., a fluorinated polymer having an unstable terminal formed by depolymerization or thermal decomposition may be included in the resin film, thus impairing the quality of the resin film or an element containing the resin film.

On the other hand, the fluorinated polymer which satisfies the requirement (1) can be suitably deposited by heating to a temperature of 400° C. or lower, as a material for deposition conducted in vacuum. Thus, it will not be depolymerized or thermally decomposed and can be used for deposition under stable deposition conditions.

The fluorinated polymer according to the present embodiment is preferably such that when the temperature is increased at a temperature-increasing rate of 2° C./min under a pressure of $1\times10^{-3}$ Pa, the thermogravimetric loss rate substantially reaches 100% at 350° C. or lower, that is, the temperature at which the thermogravimetric loss rate substantially reaches 100% is 350° C. or lower.

(Requirement (2))

The fluorinated polymer used in the production method satisfies the requirement(2).

(2) When the temperature is increased at a temperature-increasing rate of 2° C./min under a pressure of $1\times10^{-3}$ Pa, the temperature width from a temperature at which the thermogravimetric loss rate is 10% to a temperature at which it is 90%, is within 200° C.

The fluorinated polymer according to the present embodiment is considered to have a narrower molecular weight distribution as the temperature width which satisfies the requirement (2) is narrower. If a resin film is to be produced by using a fluorinated polymer which does not satisfy the requirement (2), the difference between the molecular weight of the fluorinated polymer deposited at the initial stage of the deposition and the molecular weight of the fluorinated polymer deposited at the final stage of the deposition tends to be significant, whereby in a single resin film, the molecular weight of the fluorinated polymer may change in the resin film thickness direction, and the physical properties of the resin film may not be stable.

Further, in a case where a resin film is to be produced continuously under the same conditions, if a fluorinated polymer which does not satisfy the requirement (2) is used, resin films produced may not be uniform in quality among lots.

Further, a low molecular weight product contained in the fluorinated polymer may form as out gas at the time of deposition, be attached to the interior of a vacuum chamber and contaminate the vacuum chamber. For example, in the process for producing an optoelectronic device, such a contamination source may cause a reduction of the life of the element or may cause short-circuiting, and thus remarkably impair the quality of the element.

On the other hand, with the fluorinated polymer which satisfies the requirement (2), the difference between the molecular weight of the fluorinated polymer deposited at the initial stage of the deposition and the molecular weight of the fluorinated polymer deposited at the final stage of the deposition tends to be small, whereby the change of the molecular weight of the fluorinated polymer in the resin film thickness direction tends to be small. Thus, the physical properties of the obtainable resin film tend to be stable.

Further, in a case where a resin film is produced continuously under the same conditions, non-uniformity of the resin films produced in quality among lots can be suppressed.

Further, since no low molecular weight product which may cause an out gas is contained, the vacuum chamber will not be contaminated.

The fluorinated polymer according to the present embodiment preferably satisfies a temperature width of the requirement (2) of within 100° C., more preferably within 60° C.

As a method to obtain the fluorinated polymer having a narrow molecular weight distribution, which satisfies the requirement (2), molecular weight adjustment by controlled polymerization such as living radical polymerization, or a molecular weight fractionation method by sublimation purification, supercritical extraction or size exclusion chromatography, may be mentioned.

Figure 6:
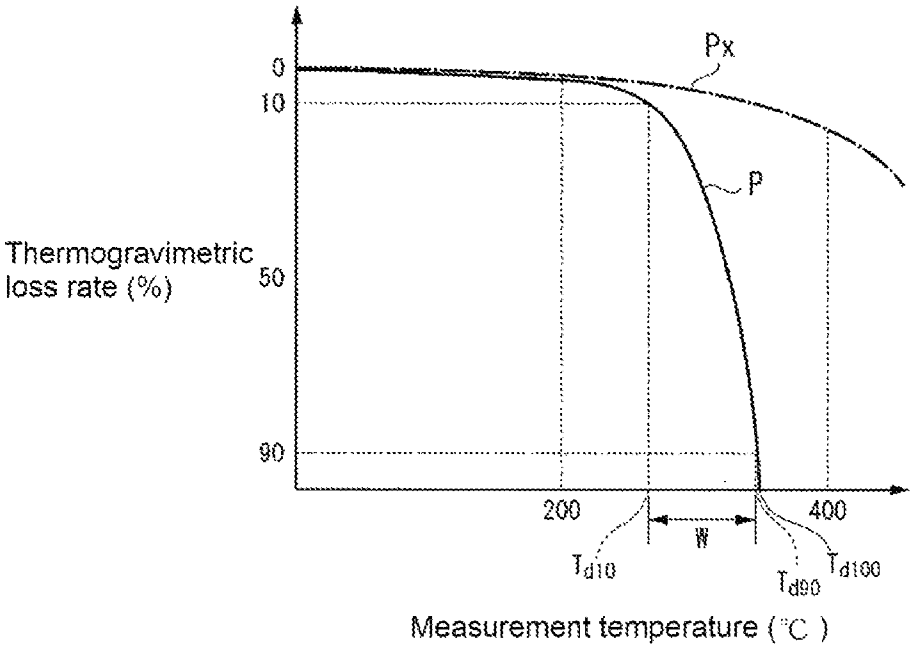
FIG. 6 is a schematic view illustrating the requirements (1) and (2).

FIG. 6 is a schematic view illustrating the requirements (1) and (2), and is a graph illustrating the relation of the thermogravimetric loss rate to the measurement temperature. The horizontal axis of FIG. 6 indicates the measurement temperature (unit: ° C.), and the vertical axis indicates the thermogravimetric loss rate (unit: %). In FIG. 6, the behavior of the fluorinated polymer which satisfies the requirements (1) and (2) is indicated by the reference P, and the behavior of the fluorinated polymer which does not satisfy the requirements (1) and (2) is indicated by the reference Px.

In FIG. 6, the graph P indicating the behavior of the fluorinated polymer according to the present embodiment, reaches a thermogravimetric loss rate of 100% at a temperature ($T_{d100}$) lower than 400° C. Whereas the graph Px indicating the behavior of the fluorinated polymer which does not satisfy the requirements (1) and (2), does not reach a thermogravimetric loss rate of 100% at 400° C.

Further, in FIG. 6, the graph P indicating the behavior of the fluorinated polymer according to the present embodiment has a value W which is $T_{d90}$-$T_{d10}$ of 200° C. or lower.

It is found from FIG. 6 that the fluorinated polymer according to the present embodiment undergoes steep thermogravimetric loss between the temperature $T_{d10}$ and the temperature $T_{d90}$.

Whether the fluorinated polymer is depolymerized or thermally decomposed at the time of deposition, and an out gas is generated, may be evaluated as follows, focusing on the change of the internal pressure in a vacuum chamber.

(Method of Evaluating Chamber Pressure Change at the Time of Deposition)

0.1 g of a fluorinated polymer is put in a vacuum deposition apparatus, the pressure in the chamber is reduced to $10^{-4}$ Pa or lower, and a film of the fluorinated polymer is formed in a thickness of 200 nm at a deposition rate of 0.1 nm/sec. On that occasion, the pressure in the chamber is monitored, and the maximum value of the pressure at the time of deposition is measured.

A fluorinated polymer with a chamber pressure increase ratio determined in accordance with the following formula of 10 times or less, can be suitably used for deposition with small depolymerization, thermal decomposition and an out gas.

Chamber pressure increase ratio at the time of deposition=maximum pressure during deposition/initial pressure before deposition A fluorinated polymer with a chamber pressure increase ratio of higher than 10 times is judged unsuitable for deposition, with significant depolymerization, thermal decomposition or an out gas.

(Molecular Weight Fractionation)

If the fluorinated polymer to be used does not satisfy the requirements (1) and (2), by molecular weight fractionation of the fluorinated polymer, a fluorinated polymer according to the present embodiment, which satisfies the requirements (1) and (2), can be obtained.

The fluorinated polymer which satisfies the requirements (1) and (2) may be obtained by molecular weight fractionation of a polymer. In the following description, a polymer to be subjected to the molecular weight fractionation will sometimes be referred to as "raw material polymer".

As a method of molecular weight fractionation, for example, a method of fractionating a polymer by the molecular weight by sublimation purification or supercritical extraction, or by size exclusion chromatography, to adjust the polymer to satisfy the requirements (1) and (2).

(Sublimation Purification)

Sublimation purification is a means such that an object to be purified (raw material polymer) is heated under reduced pressure to sublimate or evaporate a part or the whole of the object to be purified, and utilizing a precipitation (or condensation) temperature difference among compounds contained in the gaseous state object to be purified, the desired compound is isolated and recovered as a solid (or a liquid). Such sublimation purification may be conducted by using a sublimation purification apparatus having a charge portion in which the object to be purified is put, and a collecting portion which isolates the gaseous state object to be purified by the precipitation (or condensation) temperature and collects each fraction as a solid (or a liquid), and being capable of maintaining a high degree of vacuum.

The structure of the sublimation purification apparatus is not particularly limited, and for example, so-called Mill-type sublimation purification apparatus comprising a glass condenser tube, a flask-shaped glass container surrounding the condenser tube, and a vacuum exhaust device which depressurizes the interior of the glass container, may be used. Further, as the sublimation purification apparatus, a glass tube-type sublimation purification apparatus comprising a cylindrical glass sublimation tube, a heating device which contains the sublimation tube in its interior and heats the sublimation tube, and a high vacuum exhaust device which depressurizes the interior of the sublimation tube, may also be used.

Now, sublimation purification of a fluorinated polymer and a molecular weight fractionation method by sublimation purification will be described with reference to a glass tube-type sublimation purification apparatus as an example. The description here is made with reference to a case where a solid is collected, and the same applies to a case where a liquid is collected.

In sublimation purification of a fluorinated polymer, a raw material polymer is put in the charge portion of the sublimation tube, and the degree of vacuum in the sublimation tube is increased, for example, to a pressure of $1\times10^{-3}$ Pa or lower by the high vacuum exhaust device, and then the charge portion is heated by the heating device, whereby the fluorinated polymer contained in the raw material polymer is sublimated or evaporated.

A region on the side closer to exhaust by the high vacuum exhaust device than the charge portion, in the sublimation tube, corresponds to a “collecting portion”. The collecting portion is set to have a temperature lower than the heating temperature in the charge portion. The fluorinated polymer sublimated or evaporated from the raw material polymer in the charge portion is precipitated and solidified on the wall of the collecting portion, and is collected.

The collecting temperature in the collecting portion corresponds to a temperature at which the fluorinated polymer is sublimated from a gas to a solid (precipitation temperature), and corresponds to the molecular weight of the fluorinated polymer. By providing a plurality of collecting portions differing in the collecting temperature in the sublimation tube, the raw material polymer can be separated into fluorinated polymer fractions differing in the molecular weight.

For example, specifically, in a case where the charge portion is heated to A ° C. and the collecting portions are heated to B ° C. and C ° C. from the side closer to the charge portion (A>B>C), in the collecting portion set to B ° C., a fluorinated polymer within a molecular weight range such that it is in a gaseous state at A ° C. and is in a solid state at B ° C. is collected.

Likewise, in the collecting portion set to C ° C., a fluorinated polymer within a molecular weight range such that it is in a gaseous state at B ° C. and is in a solid state at C ° C. is collected. That is, in the collecting portion set to C ° C., among fluorinated polymer fractions contained in the raw material polymer, a fluorinated polymer with a collecting temperature width B ° C.-C ° C., which is in a gaseous state at B° C. and which is in a solid state at C ° C., is collected.

The above requirement (2) may be satisfied by controlling the collecting temperature width as described above and collecting the fluorinated polymer in a collecting portion with a collecting temperature width of 200° C. for example. The collected fluorinated polymer is confirmed whether it satisfies the requirement (2) or not, and if not, the temperature conditions of the collecting portion should be controlled to narrow the collecting temperature width.

A fluorinated polymer collected in a lower set temperature region in the collecting portion, is a fluorinated polymer such that its thermogravimetric loss rate reaches 100% at a lower temperature under a pressure of $1\times10^{-3}$ Pa, that is, it is a fluorinated polymer with a lower molecular weight.

The collecting temperature width is preferably 200° C. or lower, more preferably 100° C. or lower, further preferably 60° C. or lower. The smaller the collecting temperature width is, the smaller the variation of the deposition conditions tends to be, and the more stable the quality of the resin film tends to be.

Fluorinated polymer fractions differing in the collecting temperature width, separated by the molecular weight, may be mixed so long as the requirements (1) and (2) are satisfied.

(Supercritical Extraction)

Supercritical extraction is a technique to obtain an extract utilizing high solubility and diffusibility of a supercritical fluid. In supercritical extraction, for example, a fluorinated polymer having a relatively low molecular weight is dissolved in supercritical $CO_2$ used as the supercritical fluid, and an extract is obtained.

Further, by using a fluorinated solvent as an additive (entrainer) to the supercritical fluid, solubility of the fluorinated polymer in the supercritical fluid can be increased.

The fluorinated solvent used as the entrainer is not particularly limited. For example, a fluorinated solvent with a fluorophilicity parameter $P_F$ of 1 or more as determined by the following method is preferred.

(Fluorophilicity Parameter $P_F$)

To a two-phase system of 3 g of toluene and 3 g of perfluoromethylcyclohexane, 30 μL of the fluorinated solvent is dropwise added and thoroughly mixed, and left at rest overnight. Then, the fluorinated solvent contained in the toluene and the fluorinated solvent contained in the perfluoromethylcyclohexane are measured by gas chromatography. A value determined in accordance with the following formula (A), wherein $M_P$ is the concentration (unit: mL/L) of the fluorinated solvent in the toluene, and $M_F$ is the concentration (unit: mL/L) of the fluorinated solvent in the perfluoromethylcyclohexane, is taken as the fluorophilicity parameter $P_F$.

$$P_F=M_F/M_P \quad (A)$$

As the fluorinated solvent used as the entrainer, for example, the following compounds may be mentioned.

1,1,1,2,2,3,3,4,4,5,5,6,6-Tridecafluorohexane (AC-2000, manufactured by AGC Inc.) ($P_F$=12)

1,1,1,2,2,3,3,4,4,5,5,6,6-Tridecafluorooctane (AC-6000, manufactured by AGC Inc.) ($P_F$=5.6)

CYTOP CT-SOLV100E (manufactured by AGC Inc.) ($P_F$=8.2)

CYTOP CT-SOLV180 (manufactured by AGC Inc.) ($P_F$=∞)

HFE7300 (manufactured by 3M) ($P_F$=8.2)

1,1,1,2,2,3,4,5,5,5-Decafluoropentane (Vertre XF, manufactured by Chemours) ($P_F$=3.7)

1H,1H,2H,2H-Perfluorooctanol ($P_F$=1.1)

1,1,2,2-Tetrafluoroethyl-2,2,2-trifluoroethyl ether (AE-3000, manufactured by AGC Inc.) ($P_F$=0.6)

HCFC-225ca/HCFC-225cb (45/55) ($P_F$=0.3)

Perfluorobenzene ($P_F$=0.3)

Hexafluoro-2-propanol ($P_F$=0.24)

1H,1H,7H-Perfluoroheptanol ($P_F$=0.23)

1H,1H,5H-Perfluoropentanol ($P_F$=0.1)

The extraction step may be conducted, for example, by using supercritical $CO_2$ under an extraction pressure of 7.4 MPa or higher at an extraction temperature of 31° C. or higher.

The extraction pressure is preferably 30 MPa or higher, more preferably 50 MPa or higher, further preferably 70 MPa or higher. The upper limit of the extraction pressure is not particularly limited and is preferably 100 MPa or lower. The upper limit and the lower limit of the extraction pressure may optionally be combined.

The extraction temperature is preferably 40° C. or higher, more preferably 80° C. or higher. The extraction temperature is preferably 300° C. or lower, more preferably 200° C. or lower, further preferably 100° C. or lower. The upper limit and the lower limit of the extraction temperature may optionally be combined.

Within the above range, the desired fluorinated polymer can efficiently be obtained by molecular weight fractionation.

Molecular weight fractionation is useful also for removing remaining foreign matters such as the initiator, the chain transfer agent and the solvent used in the step of polymerization for the fluorinated polymer, and by-products. Such remaining foreign matters may form as an out gas at the time of deposition and be attached to the interior of a vacuum chamber and contaminate the vacuum chamber. Accordingly, even when the requirements (1) and (2) are satisfied, sublimation purification or supercritical extraction is more preferably carried out.

Fluorinated polymer fractions differing in the extraction conditions, separated by the molecular weight, may be mixed so long as the requirements (1) and (2) are satisfied.

(Structure of Fluorinated Polymer)

The fluorinated polymer used in the conductive film and the method for producing the conductive film according to the present embodiment is not restricted with respect to its units so long as it is a fluorinated polymer which satisfies the above requirements (1) and (2).

The fluorine atom content of the fluorinated polymer is preferably 20 mass % or more, more preferably 40 mass % or more, further preferably 60 mass % or more, particularly preferably 70 mass % or more. The higher the fluorine atom content is, the lower the surface energy of an obtainable resin film 15 tends to be, and the less the conductive material 10X will be attached to the surface of the resin film 15. Accordingly, by using a fluorinated polymer having such a fluorine atom content, patterning between the thick film portion 11 and the thin film portion 12 is likely to be conducted.

The fluorine atom content (mass %) is obtained in accordance with the following formula.

$$(\text{Fluorine atom content})=[19\times NF/MA]\times 100$$

NF: the sum of products of the total atomic weight of fluorine atoms constituting each type of units constituting the fluorinated polymer, and the mole fraction of the units to all units.

MA: the sum of products of the total atomic weight of all atoms constituting each type of units constituting the fluorinated polymer, and the mole fraction of the units to all units.

The above NF and MA are calculated by the mole fraction of the constituting units and the amount of terminals of the fluorinated polymer, obtained by $^1$H-NMR, $^{19}$F-NMR, elemental analysis and IR. Further, NF and MA may also be calculated from the amounts of monomers and an initiator charged in production of the fluorinated polymer.

The fluorinated polymer preferably has a trifluoromethyl moiety. The “trifluoromethyl moiety” means $CF_3$—. The trifluoromethyl moiety includes, in addition to a trifluoromethyl group, a part of a structure of a substituent, such as $CF_3$— contained in a pentafluoroethyl group.

The content of the trifluoromethyl moiety is preferably 0.1 mmol/g or more, more preferably 0.3 mmol/g or more, further preferably 0.6 mmol/g or more. The higher the content of the trifluoromethyl moiety is, the lower the surface energy of the resin film 15 tends to be. Thus, in the dry coating step shown in FIG. 5, the conductive material 10X is hardly attached to the surface of the resin film 15, and patterning between the thick film portion 11 and the thin film portion 12 is likely to be conducted.

The content (mmol/g) of the trifluoromethyl moiety is obtained in accordance with the following formula.

$$(\text{Content of trifluoromethyl moiety})=[NCF_3/MA]\times 1{,}000$$

$NCF_3$: the sum of products of the number of moles of the trifluoromethyl moiety constituting each type of units constituting the fluorinated polymer, and the mole fraction of the units to all units.

MA: the sum of products of the total atomic weight of all atoms constituting each type of units constituting the fluorinated polymer, and the mole fraction of the units to all units.

The above $NCF_3$ and MA are calculated by the mole fraction of the constituting units and the amount of terminals of the fluorinated polymer, obtained by $^1$H-NMR, $^{19}$F-NMR, elemental analysis and IR. Further, $NCF_3$ and MA may also be calculated from the amounts of monomers and an initiator charged in production of the fluorinated polymer.

The fluorinated polymer is preferably the following polymer (1) or polymer (2).

Polymer (1): a fluorinated polymer having no aliphatic ring in its main chain and having fluoroolefin units.

Polymer (2): a fluorinated polymer having an aliphatic ring in its main chain.

In the present invention, as the fluorinated polymer, only one of the polymers (1) and (2) may be used, or both the polymers (1) and (2) may be used in combination.

<<Polymer (1)>>

The polymer (1) may be a homopolymer of a fluoroolefin, may be a copolymer of two or more types of fluoroolefins, or may be a copolymer of a fluoroolefin and a monomer copolymerizable with a fluoroolefin.

The fluoroolefin may be a perfluoroolefin such as tetrafluoroethylene (TFE) or hexafluoropropene (HFP), or a perfluoro(alkyl vinyl ether) such as perfluoro(methyl vinyl ether (PMVE), perfluoro(ethyl vinyl ether) (PEVE) or perfluoro(propyl vinyl ether) (PPVE).

The perfluoro(alkyl vinyl ether) may be represented as a perfluoro(alkoxyethylene).

As the fluoroolefin, a fluoroolefin containing a hydrogen atom or a chlorine atom, such as chlorotrifluoroethylene (CTFE), trifluoroethylene (TrFE), vinylidene fluoride (VdF), 1,2-difluoroethylene or 1-fluoroethylene may also be mentioned.

The monomer copolymerizable with a fluoroolefin may, for example, be an olefin such as ethylene or propylene, a vinyl ether, a vinyl ester, an aromatic vinyl compound such as styrene, an allyl compound such as an allyl ether, an acryloyl compound or a methacryloyl compound.

Further, a fluorinated monomer having a perfluoroalkyl group or a perfluoropolyether group, such as a vinyl ether, a vinyl ester, an aromatic vinyl compound, an allyl compound, an acryloyl compound or a methacryloyl compound, may also be used.

Among them, the polymer (1) preferably has perfluoro (alkyl vinyl ether) units. More specifically, the fluorinated polymer preferably has PPVE units.

When the content of the PPVE units in the polymer (1) changes, the crystallinity changes. Specifically, as the content of the PPVE units in the fluorinated polymer increases, the crystallinity of the fluorinated polymer decreases.

The content of the PPVE units is, to the total number of moles of all monomer units constituting the fluorinated polymer, preferably 2 mol % or more, more preferably 4 mol % or more, further preferably 6 mol % or more. Within the above range, the crystallinity of the obtained resin film tends to be low, the conductive material 10X is hardly attached to the surface of the resin film 15, and patterning between the thick film portion 11 and the thin film portion 12 will ready be conducted, such being preferred.

The content of the PPVE units is, to the total number of moles of all monomer units constituting the fluorinated polymer, preferably 15 mol % or less, more preferably 12 mol % or less, further preferably 10 mol % or less. Out of the above range, the softening temperature of the obtained resin film tends to decrease, and the shape of a film formed of the fluorinated polymer may not be maintained at a process temperature in element preparation or under element use conditions.

In a case where the polymer (1) is a copolymer, the proportion of the fluoroolefin units is preferably 20 mol % or more, more preferably 40 mol % or more, further preferably 80 mol % or more.

The polymer (1) may be a synthetic product or may be a commercial product.

As the polymer (1), the following polymers, etc., may be mentioned.

Polytetrafluoroethylene (PTFE)

Tetrafluoroethylene/perfluoro(alkyl vinyl ether) copolymer (PFA)

Tetrafluoroethylene/hexafluoropropylene copolymer (FEP)

Tetrafluoroethylene/perfluoro(alkyl vinyl ether)/hexafluoropropylene copolymer (EPA)

Ethylene/tetrafluoroethylene copolymer (ETFE)

Polyvinylidene fluoride (PVDF)

Polyvinyl fluoride (PVF)

Polychlorotrifluoroethylene (PCTFE)

Ethylene/chlorotrifluoroethylene copolymer (ECTFE)

Among them, in that pattering of the thick film portion 11 and the thin film portion 12 will readily be conducted, preferred is a polymer having all hydrogen atoms bonded to a carbon atom replaced with fluorine. That is, polytetrafluoroethylene (PTFE), a tetrafluoroethylene/perfluoro(alkyl vinyl ether) copolymer (PFA), a tetrafluoroethylene/hexafluoropropylene copolymer (FEP), or a tetrafluoroethylene/perfluoro(alkyl vinyl ether)/hexafluoropropylene copolymer (EPA) is preferred.

The tetrafluoroethylene/perfluoro(alkyl vinyl ether) copolymer (PFA) has at least tetrafluoroethylene units and perfluoro(alkyl vinyl ether) units, and may further have other perfluoromonomer units.

The polymer (1) may be produced by a known method.

The polymer (1) may be a synthetic product or may be a commercial product.

<<Polymer (2)>>

The polymer (2) is a fluorinated polymer having an aliphatic ring in its main chain.

The "fluorinated polymer having an aliphatic ring in its main chain" means a fluorinated polymer having units having an aliphatic ring structure and at least one of carbon atoms constituting the aliphatic ring being a carbon atom constituting the main chain. The aliphatic ring may be a ring having a hetero atom such as an oxygen atom.

The "main chain" of a polymer means, in the case of a polymer of a monoene, a chain of carbon atoms derived from the two carbon atoms which had constituted the polymerizable double bond.

Further, in the case of a cyclic polymer of a cyclopolymerizable diene, it means a chain of carbon atoms derived from the four carbon atoms which had constituted the two polymerizable double bonds.

Further, in the case of a copolymer of a monoene and a cyclopolymerizable diene, it means a chain of carbon atoms derived from the two carbon atoms of the monoene and the four carbon atoms of the diene.

In a case where the monoene is a monoene having a polymerizable double bond between one carbon atom constituting the ring skeleton of an aliphatic ring and a carbon atom outside the ring, the main chain of the polymer having an aliphatic ring in its main chain has one carbon atom constituting the ring skeleton which had constituted the polymerizable double bond of the monoene. Further, in a case where the monoene is a monoene having a polymerizable double bond between adjacent two carbon atoms constituting the ring skeleton of an aliphatic ring, the main chain of the polymer having an aliphatic ring in its main chain has two carbon atoms constituting the ring skeleton which had constituted the polymerizable double bond of the monoene.

In the case of the cyclopolymerizable diene, the main chain of a polymer having an aliphatic ring in its main chain has four carbon atoms which had constituted the two polymerizable double bonds of the diene, and two to four among the four carbon atoms constitute the ring skeleton of the aliphatic ring.

The number of atoms constituting the ring skeleton of the aliphatic ring in the polymer (2) is preferably from 4 to 7, particularly preferably from 5 to 6. That is, the aliphatic ring is preferably a 4- to 7-membered ring, particularly preferably a 5- to 6-membered ring. In a case where the aliphatic ring has a hetero atom as a ring-constituting atom, the hetero atom may be an oxygen atom, a nitrogen atom or the like, and is preferably an oxygen atom. The number of the hetero atom constituting the ring is preferably from 1 to 3, more preferably 1 or 2.

The aliphatic ring may or may not have a substituent. "may have a substituent" means that a substituent may be bonded to an atom constituting the ring skeleton of the aliphatic ring.

The hydrogen atom bonded to a carbon atom constituting the aliphatic ring of the polymer (2) is preferably replaced with a fluorine atom. In a case where the aliphatic ring has a substituent which has a hydrogen atom bonded to its carbon atom also, the hydrogen atom is preferably replaced with a fluorine atom. The substituent having a fluorine atom may, for example, be a perfluoroalkyl group, a perfluoroalkoxy group or $=CF_2$.

The aliphatic ring in the polymer (2) is preferably a perfluoroaliphatic ring (an aliphatic ring having all hydrogen atoms bonded to a carbon atom, including the substituent, replaced with fluorine atoms).

As the polymer (2), the following polymers (21) and (22) may be mentioned.

Polymer (21): a fluorinated polymer having units derived from a cyclic fluorinated monoene.

Polymer (22): a fluorinated polymer having units formed by cyclopolymerization of a cyclopolymerizable fluorinated diene (hereinafter sometimes referred to simply as "fluorinated diene").

Polymer (21):

The "fluorinated cyclic monoene" is a fluorinated monomer having one polymerizable double bond between carbon atoms constituting the aliphatic ring, or a fluorinated monomer having one polymerizable double bond between a carbon atom constituting the aliphatic ring and a carbon atom outside the aliphatic ring.

The fluorinated cyclic monoene is preferably the following compound (1) or (2).

(1)

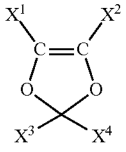

(2)

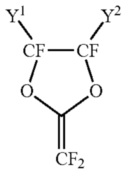

wherein $X^1$, $X^2$, $X^3$, $X^4$, $Y^1$ and $Y^2$ are each independently a fluorine atom, a perfluoroalkyl group which may contain an etheric oxygen atom (—O—), or a perfluoroalkoxy group which may contain an etheric oxygen atom, and $X^3$ and $X^4$ may be mutually bonded to form a ring.

The perfluoroalkyl group as each of $X^1$, $X^2$, $X^3$, $X^4$, $Y^1$ and $Y^2$ has preferably from 1 to 7, particularly preferably from 1 to 4 carbon atoms. The perfluoroalkyl group is preferably linear or branched, particularly preferably linear. Specifically, it may be a trifluoromethyl group, a pentafluoroethyl group or a heptafluoropropyl group, and is particularly preferably a trifluoromethyl group.

The perfluoroalkoxy group as each of $X^1$, $X^2$, $X^3$, $X^4$, $Y^1$ and $Y^2$ may be one having an oxygen atom (—O—) bonded to the perfluoroalkyl group, particularly preferably a trifluoromethoxy group.

In the formula (1), $X^1$ is preferably a fluorine atom.

$X^2$ is preferably a fluorine atom, a trifluoromethyl group or a $C_{1-4}$ perfluoroalkoxy group, particularly preferably a fluorine atom or a trifluoromethoxy group.

$X^3$ and $X^4$ are preferably each independently a fluorine atom or a $C_{1-4}$ perfluoroalkyl group, particularly preferably a fluorine atom or a trifluoromethyl group.

$X^3$ and $X^4$ may be mutually bonded to form a ring. The number of atoms constituting the ring skeleton of the ring is preferably from 4 to 7, particularly preferably from 5 to 6.

As specific examples of preferred compound (1), compounds (1-1) to (1-5) may be mentioned.

(1-1)

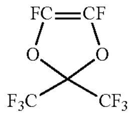

(1-2)

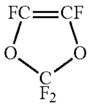

(1-3)

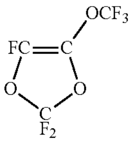

(1-4)

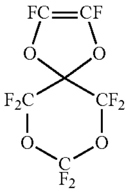

(1-5)

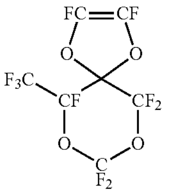

In the formula (2), $Y^1$ and $Y^2$ are preferably each independently a fluorine atom, a $C_{1-4}$ perfluoroalkyl group or a $C_{1-4}$ perfluoroalkoxy group, particularly preferably a fluorine atom or a trifluoromethyl group.

As specific examples of preferred compound (2), compounds (2-1) and (2-2) may be mentioned.

(2-1)

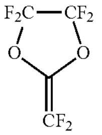

(2-2)

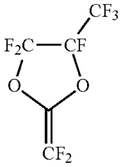

The polymer (21) may be a homopolymer of the above-described fluorinated cyclic monoene, or may be a copolymer with other monomer copolymerizable with the fluorinated cyclic monoene.

Here, the proportion of the units derived from the fluorinated cyclic monoene to all units in the polymer (21) is preferably 20 mol % or more, more preferably 40 mol % or more, further preferably 100 mol %.

As other monomer copolymerizable with the fluorinated cyclic monoene, for example, a fluorinated diene, a monomer having a reactive functional group in its side chain, tetrafluoroethylene, chlorotrifluoroethylene or a perfluoroalkyl vinyl ether may, for example, be mentioned.

The fluorinated diene may be one as explained for the after-described polymer (22). The monomer having a reactive functional group in its side chain may be a monomer having a polymerizable double bond and a reactive functional group. The polymerizable double bond may, for example, be $CF_2{=}CF{-}$, $CF_2{=}CH{-}$, $CH_2{=}CF{-}$, $CFH{=}CF{-}$, $CFH{=}CH{-}$, $CF_2{=}C{-}$ or $CF{=}CF{-}$.

A polymer obtained by copolymerization of the fluorinated cyclic monoene and the fluorinated diene is taken as a polymer (21).

Polymer (22):

A "fluorinated diene" is a cyclopolymerizable fluorinated monomer having two polymerizable double bonds and a fluorine atom. The polymerizable double bond is preferably a vinyl group, an allyl group, an acryloyl group or a methacryloyl group. The fluorinated diene is preferably the following compound (3).

$$CF_2{=}CF\text{-}Q\text{-}CF{=}CF_2 \quad (3)$$

In the formula (3), Q is a $C_{1-5}$, preferably $C_{1-3}$ perfluoroalkylene group which may be branched, which may contain an etheric oxygen atom, and in which one or more of fluorine atoms may be replaced with a halogen atom other than a fluorine atom. The halogen atom other than a fluorine atom may, for example, be a chlorine atom or a bromine atom.

Q is preferably a perfluoroalkylene group containing an etheric oxygen atom. In such a case, the etheric oxygen atom in the perfluoroalkylene group may be present on one terminal of the perfluoroalkylene group, may be present on both terminals of the perfluoroalkylene group, or may be present between carbon atoms of the perfluoroalkylene group. In view of cyclopolymerizability, the etheric oxygen atom is present preferably on one terminal of the perfluoroalkylene group.

As specific examples of the compound (3), the following compounds may be mentioned.

$CF_2{=}CFOCF_2CF{=}CF_2$,
$CF_2{=}CFOCF(CF_3)CF{=}CF_2$,
$CF_2{=}CFOCF_2CF_2CF{=}CF_2$,
$CF_2{=}CFOCF_2CF(CF_3)CF{=}CF_2$,
$CF_2{=}CFOCF(CF_3)CF_2CF{=}CF_2$,
$CF_2{=}CFOCFClCF_2CF{=}CF_2$,
$CF_2{=}CFOCCl_2CF_2CF{=}CF_2$,
$CF_2{=}CFOCF_{20}CF{=}CF_2$,
$CF_2{=}CFOC(CF_3)_2OCF{=}CF_2$,
$CF_2{=}CFOCF_2CF(OCF_3)CF{=}CF_2$,
$CF_2{=}CFCF_2CF{=}CF_2$,
$CF_2{=}CFCF_2CF_2CF{=}CF_2$,
$CF_2{=}CFCF_2OCF_2CF{=}CF_2$.

As the units formed by cyclopolymerization of the compound (3), the following units (3-1) to (3-4) may be mentioned.

(3-1)

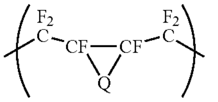

(3-2)

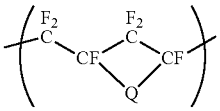

(3-3)

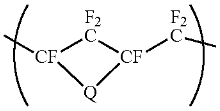

(3-4)

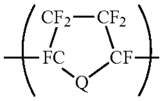

The polymer (22) may be a homopolymer of the fluorinated diene, or may be a copolymer with other monomer copolymerizable with the fluorinated diene.

As other monomer copolymerizable with the fluorinated diene, for example, a monomer having a reactive functional group in its side chain, tetrafluoroethylene, chlorotrifluoroethylene or a perfluoro(methyl vinyl ether) may be mentioned.

As specific examples of the polymer (22), for example, a polymer having units represented by the following formula (3-1-1), obtained by cyclopolymerization of $CF_2{=}CFOCF_2CF_2CF{=}CF_2$ (perfluoro(3-butenyl vinyl ether)) may be mentioned. Hereinafter, perfluoro(3-butenyl vinyl ether) will be referred to as "BVE".

(3-1-1)

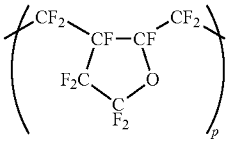

In the formula (3-1-1), p is an integer of from 5 to 1,000. p is preferably an integer of from 10 to 800, particularly preferably from 10 to 500.

The polymer (2) may be a synthetic product or may be a commercial product.

As specific examples of the polymer (2), a BVE cyclic polymer (manufactured by AGC Inc., CYTOP (registered trademark)), a tetrafluoroethylene/perfluoro(4-methoxy-1,3-dioxol) copolymer (manufactured by Solvay, Hyflon (registered trademark) AD), a tetrafluoroethylene/perfluoro(2,2-dimethyl-1,3-dioxol) copolymer (manufactured by Dupont, Teflon (registered trademark) AF), and a perfluoro(4-methyl-2-methylene-1,3-dioxolane) polymer (MMD polymer) are preferred.

In the present invention, as the fluorinated polymer, one of the polymers (1) and (2) may be used, or the polymers (1) and (2) may be used in combination.

(Terminal Structure of Fluorinated Polymer)

The fluorinated polymer is obtained usually by polymerizing the above monomers by radical polymerization using a radical polymerization initiator. In such a case, the fluorinated polymer at the time of completion of the polymerization is considered to have a structure having fragments of the radical polymerization initiator used for the polymerization added, as the structure at the terminal of the molecular chain (main chain). Further, in a case where a chain transfer agent is used for polymerization, the structure at the terminal of the molecular chain (main chain) may be a structure having fragments of the chain transfer agent added.

Of the fluorinated polymer, the above terminal structure may be converted to other structure. For example, by subjecting the fluorinated polymer at the time of completion of the polymerization to heat treatment at 250° C. or higher, the structure at the terminal of the main chain becomes —C(═O)—F, and the fluorinated polymer becomes an acid fluoride.

By subjecting the acid fluoride to methanol treatment, the structure at the terminal of the main chain becomes a methyl ester group. The acid fluoride with high reactivity may be converted into a methyl ester group by simple methanol treatment. Thus, the stability of the obtainable fluorinated polymer is likely to be improved, such being favorable.

Further, by subjecting the acid fluoride to fluorination treatment, the structure at the terminal of the main chain becomes a trifluoromethyl group. As the fluorination treatment, for example, treatment method disclosed in JP-A-H11-152310, paragraph [0040] may be mentioned. The trifluoromethyl group has high heat resistance and is likely to improve heat resistance of the obtainable fluorinated polymer, and is thereby preferred. Further, when the fluorinated polymer has a trifluoromethyl group at its terminal, the surface energy of the obtained resin film tends to be low, the conductive material 10X is hardly attached to the surface of the resin film 15, and patterning between the thick film portion 11 and the thin film portion 12 will readily be conducted.

The fluorinated polymer preferably has, as the structure at the terminal of the main chain, a methyl ester group or a trifluoromethyl group, whereby intermolecular interaction at the terminal of the main chain tends to be small, and deposition will readily be conducted.

The above-described structure at the terminal of the main chain can be confirmed by infrared spectroscopy.

(Crystallinity of Fluorinated Polymer)

The fluorinated polymer according to the present embodiment preferably has low crystallinity or be amorphous. If the fluorinated polymer has high crystallinity, in deposition for the conductive film, the grain boundaries (interfaces) of the crystals tend to be an origin of nucleation, and the probability of attachment of the conductive film increases. That is, the fluorinated polymer preferably has low crystallinity or be amorphous, whereby patterning between the thick film portion 11 and the thin film portion 12 will readily be conducted.

As one index to evaluate crystallinity of the fluorinated polymer, the melting point may be mentioned.

For example, when the above polymer (1) has PPVE units, as the content of the PPVE units increases, the crystallinity of the fluorinated polymer decreases, and the melting point decreases at the same time.

Further, since the polymer (2) has low crystalline or amorphous properties, since crystallinity of the aliphatic ring structure is likely to be disturbed. When the polymer (2) is amorphous, no melting point is observed.

In the present embodiment, as the melting point, a value measured by a differential scanning calorimeter (for example, manufactured by NETZSCH, DSC 204 F1 Phoenix) is employed. Specifically, 9 mg of the fluorinated polymer is put in a sample container, the heat capacity when the temperature is increased from −70° C. to 350° C. at a rate of 10° C. per minute is measured, and the melting point is determined from the obtained melting peak.

The melting point of the fluorinated polymer used in the present embodiment is preferably 300° C. or lower, more preferably 270° C. or lower, further preferably 240° C. or lower. The lower limit of the melting point is not particularly limited, and with a view to keeping the shape of the film formed of the fluorinated polymer, it is preferably 100° C. or higher.

Further, it is also preferred that the fluorinated polymer is amorphous. In such a case, the melting point is not measured by the above method.

(Molecular Weight of Fluorinated Polymer)

It is difficult to measure the molecular weight of a fluorinated polymer having high crystallinity since it is hardly soluble in a solvent, whereas the molecular weight of an amorphous fluorinated polymer, which is highly soluble in a fluorinated solvent, can be measured by gel permeation chromatography (GPC) or the like.

The weight average molecular weight (hereinafter referred to as "Mw") of the fluorinated polymer is preferably from 1,000 to 20,000, more preferably from 1,500 to 15,000, further preferably from 2,000 to 10,000.

If the weight average molecular weight is lower than 1,000, the fluororesin has a low softening temperature, and the shape of a film formed of the fluorinated polymer may not be kept at a process temperature in element preparation or under element use conditions.

If the weight average molecular weight is higher than 20,000, the main chain of the fluorinated polymer will be cleaved at the time of deposition and the fluorinated polymer will have a lower molecular weight, and thus the strength of the layer to be formed tends to be insufficient, and further, defects due to decomposed products will occur, and thus no smooth surface is likely to be obtained. Further, possibility that molecules or ions generated by cleavage of the main chain will be unintentionally included and will affect conductivity of the conductive film is considered. Further, the life of an element having the conductive film according to the present embodiment (for example light-emitting life of an organic EL element) may be shortened.

Accordingly, when Mw of the fluorinated polymer is within a range of from 1,000 to 20,000, the main chain of the fluorinated polymer will not be cleaved, and a layer having sufficient strength and a smooth surface can be formed.

The weight average molecular weight of the fluorinated polymer is a value measured by gel permeation chromatography (GPC). First, a PMMA reference sample having a known molecular weight is subjected to GPC, and a calibration curve is prepared from the elution time of the peak top and the molecular weight. Then, the fluorinated polymer is subjected to GPC, and Mw and Mn are obtained from the calibration curve. As a mobile phase solvent, a solvent mixture of 1,1,1,2,3,4,4,5,5,5-decafluoro-3-methoxy-2-(trifluoromethyl)pentane/hexafluoroisopropyl alcohol (volume ratio 85/15) is used.

The "molecular weight distribution" is the ratio of Mw to the number average molecular weight (hereinafter referred to as "Mn"), that is Mw/Mn.

From the viewpoint of stability of the quality of the layer to be formed, the molecular weight distribution (Mw/Mn) of the fluorinated polymer is preferably smaller, and is preferably 2 or less. The molecular weight distribution of the fluorinated polymer is more preferably 1.5 or less, further preferably 1.2 or less. The theoretical lower limit of the molecular weight distribution is 1.

The smaller the molecular weight distribution of the fluorinated polymer is, the smaller the variation of the deposition conditions tends to be, and the more a phase separated structure homogeneous in the film thickness direction is likely to be formed.

As a method of obtaining a fluorinated polymer with a small molecular weight distribution, molecular weight adjustment by controlled polymerization such as living radial polymerization, or a molecular weight fractionation method by sublimation purification or supercritical extraction, or by size exclusion chromatography, may be mentioned.

In this specification, the weight average molecular weight and the molecular weight distribution are values measured by gel permeation chromatography (GPC).

(Surface Energy of Resin Film)

The resin film 15 formed of the fluorinated polymer as a material has a surface energy of 30 mN/m or less, more preferably 25 mN/m or less, further preferably 20 mN/m or less. When the resin film 15 has such a surface energy, when the conductive material 10X is applied by dry coating, the conductive material 10X will hardly be attached to the surface of the resin film 15, and patterning will readily be conducted.

The surface energy of the resin film 15 may be adjusted by changing the fluorine atom content or the content of the trifluoromethyl moiety in the fluorinated polymer to be used. By increasing the fluorine atom content or the content of the trifluoromethyl moiety in the fluorinated polymer, the surface energy of the resin film 15 tends to be small.

The conductive film of the above constitution, is a novel conductive film having two regions differing in the light transmittance.

Further, according to the above method for producing a conductive film, such a conductive film can readily be produced.

The present embodiment is described above with reference to a case where the thin film portion 12 is present in the second region 10B of the conductive film 1, however, the thin film portion 12 may not be present.

Further, the present embodiment is described above with reference to a case where the resin film 15 is present in the second region 10B of the conductive film 1, however, a step of removing the resin film may be conducted after the dry coating step shown in FIG. 5. By removing the resin film 15, the resin film 15 and the thin film portion 12 can be removed at the same time.

Figure 7:
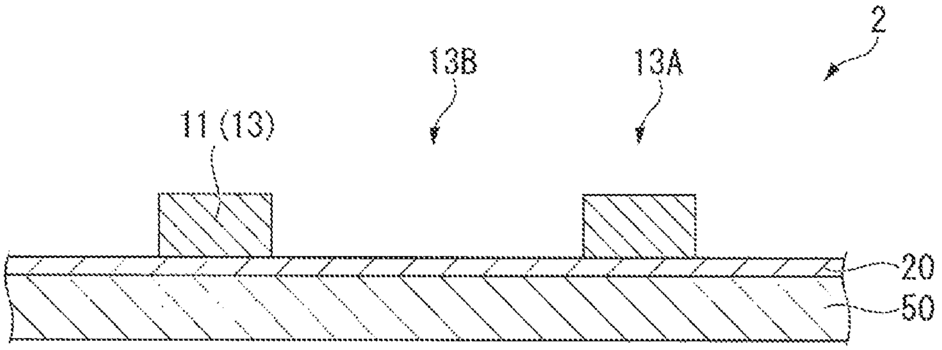
FIG. 7 is a schematic view illustrating a conductive film 2 obtained by removing a resin film 15.

FIG. 7 is a schematic view illustrating a conductive film 2 obtained by removing the resin film 15, and is a view corresponding to FIG. 2. As shown in FIG. 7, the conductive film 2 has the first film 13 and the second film 20. At the first region 13A of the conductive film 2, the thick film portion 11 in a lattice form and the second film 20 overlap with each other. Further, at the second region 13B of the conductive film 2, the second film 20 is present.

In the conductive film 2 of such a constitution, the light transmittance at the second region 13B is higher than the light transmittance at the second region 10B of the conductive film 1, and thus a high contrast between the first region 13A and the second region 13B will be achieved.

As a method of removing the resin film 15, for example, a method of dissolving or separating the fluorinated polymer using a fluorinated solvent, or a method of removing the resin film 15 by dry etching may be mentioned.

As the fluorinated solvent, a solvent which dissolves the resin film 15 and which dissolves substantially no other material constituting the substrate on which the conductive film 1 is formed, is used. Accordingly, the fluorinated polymer can be removed without impairing the quality of the organic optoelectronic device.

The fluorinated solvent used for removing the fluorinated polymer is preferably, for example, a fluorinated solvent with the above-described fluorophilicity parameter $P_F$ of 1 or more.

Further, the present embodiment is described above with reference to a case where the second film 20 is present, however, the second film 20 may not be present.

Figure 8:
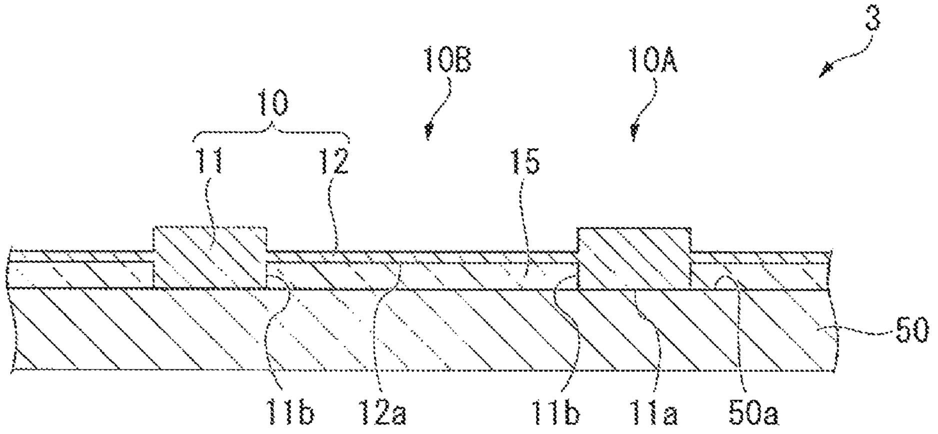
FIG. 8 is a schematic view illustrating a conductive film 3.

FIG. 8 is a view illustrating a modified example of the present embodiment, and is a view corresponding to FIG. 2.

The conductive film 3 shown in FIG. 8 has the first film 10 and the resin film 15. The first film 10 is provided on the substrate 50. The resin film 15 is provided between the first film 10 and the substrate 50.

The lower side 11*a* of the thick film portion 11 of the first film 10 is in contact with the substrate 50. Further, the side surface 11*b* of the thick film portion 11 is in contact with the resin film 15.

The lower surface 12*a* of the thin film portion 12 of the first film 11 is in contact with the resin film 15.

Such a conductive film 3 can be produced in the same manner as in the above method for producing a conductive film except that the step shown in FIG. 3 is not conducted and the fluorinated polymer P is deposited directly on the surface 50*a* of the substrate 50.

Further, the step of removing the resin film 15 may be conducted, after the conductive film 3 is produced by the dry coating step shown in FIG. 5.

Second Embodiment

According to the second embodiment of the present invention, an optoelectronic device comprising the conductive film according to the first embodiment of the present invention is provided. Such an optoelectronic device is preferably an organic EL element comprising a substrate, an anode provided on the substrate, a cathode facing the anode, and an active layer disposed between the cathode and the anode, wherein the cathode is the conductive film according to the first embodiment of the present invention.

Figure 9:
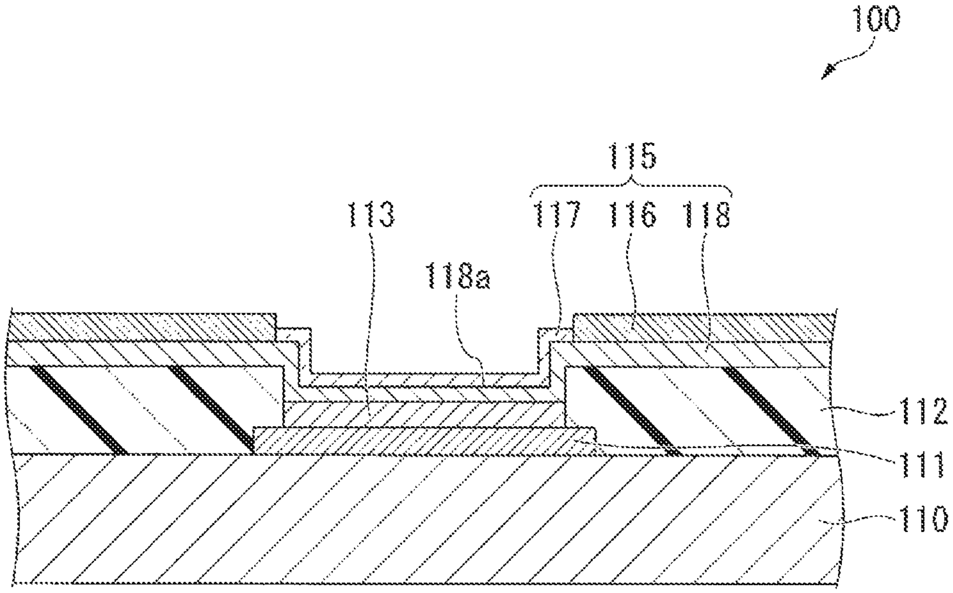
FIG. 9 is a schematic cross sectional view illustrating an optoelectronic device (an organic EL element) 100 according to a second embodiment.

FIG. 9 is a schematic cross sectional view illustrating an organic EL element (optoelectronic device according to a second embodiment of the present invention) 100. The organic EL element 100 has a structure having a substrate 110, an anode 111, a partition wall 112, a functional layer 113 and a cathode 115 laminated in this order. The functional layer 113 contains a light emitting layer.

The organic EL element 100 according to the present embodiment employs top emission system in which light L generated in the functional layer 113 is taken to the outside via the cathode 115.

(Substrate)

The substrate 110 may have optical transparency or may not have optical transparency. The material forming the substrate 110 may be an inorganic material such as glass, quartz glass or silicon nitride, or an organic polymer (resin) such as a polyimide resin, an acrylic resin or a polycarbonate resin. Further, so long as the electrical insulating property of the surface is secured, the material forming the substrate 110 may be a metal material.

Further, the substrate 110 has various wires and drive elements electrically connected to the organic EL element, which are not shown.

(Anode)

The anode 111 is formed on the substrate 110 and supplies holes to the functional layer 113. Further, the anode 111 has light reflectivity which reflects light emitted from the light emitting layer contained in the functional layer 113.

The material forming the anode 111 is a conductive material. As the conductive material, a conductive metal oxide such as ITO or IZO may be used. Further, in order to impart light reflectivity to the anode 111, on the substrate 110 side of the anode 111 or on the functional layer 113 side of the anode 111, a reflective film formed of a metal as a material may be provided. That is, the anode 111 may have a laminated structure of a layer formed of a conductive metal oxide as a material and a reflective film formed of a metal as a material.

Further, as the material forming the anode 111, a metal such as silver may also be used.

The thickness of the anode 111 is not particularly limited and is preferably from 30 to 300 nm. The thickness of the anode 111 is, for example, 100 nm.

(Partition Wall)

The partition wall 112 partially overlaps with the periphery of the anode 111 and is formed, for example, in a lattice form. In the openings of the partition wall 112, the functional layer 113 is formed to partition the organic EL element 100.

The partition wall 112 is formed, for example, by a resin such as a polyimide as a material.

(Functional Layer)

The functional layer 113 is formed to overlap with the anode 111. The functional layer 113 has a light emitting layer. In the light emitting layer, holes injected from the anode 111 and electrons injected from the cathode 115 are recombined to emit light by emitting photons. The emission wavelength at that time is determined depending on the material for forming the light emitting layer. The light emitting layer corresponds to the "active layer" in the present invention.

The light emitting layer may be formed by using a material known as a material of a light emitting layer of an organic EL element.

The material for forming the light emitting layer may be used alone or may be used in combination of two or more, and it is suitably selected depending on the desired light emission wavelength.

The functional layer 113 may have a hole injection layer and a hole transport layer between the light emitting layer and the anode 111.

The hole injection layer has a function to facilitate injection of holes from the anode to the hole transport layer.

The hole transport layer has a function to favorably transport holes injected from the anode 111 toward the light emitting layer.

Further, the functional layer 113 may have an electron transport layer and an electron injection layer between the light emitting layer and the cathode 115.

The electron transport layer has a function to favorably transport electrons injected from the cathode 115 toward the light emitting layer.

The electron injection layer has a function to facilitate injection of electrons from the cathode 115 to the electron transport layer.

(Cathode)

The cathode 115 is formed to entirely cover the partition wall 112 and the functional layer 113. The cathode 115 has a function to inject electrons to the functional layer.

In the optoelectronic device according to the present embodiment, as the cathode 115, the above-described conductive film of the present invention is employed. The cathode 115 has a first film 116, a resin film 117 and a second film 118.

The second film 118 is formed to cover the partition wall 112 and the functional layer 113. As the constitution and the material of the second film 118, the constitution and the material described for the second film 20 according to the first embodiment can be employed.

The resin film 117 two-dimensionally overlaps with the functional layer 113 and is formed on the upper surface 118*a* of the second film 118. As the constitution and the material of the resin film 117, the constitution and the material described for the resin film 15 of the first embodiment, can be employed.

The first film 116 is formed to two-dimensionally overlap with the partition wall 112. As the constitution and the material of the first film 116, the constitution and the material described for the first film 10 according to the first embodiment may be employed.

That is, the first region of the cathode 115 overlaps with the partition wall 112, and the second region of the cathode 115 overlaps with the functional layer 113 including the light emitting layer.

(Microcavity Structure)

In the organic EL element 100 of the present embodiment, the anode 111 and the cathode 115 constitute a light resonator structure (microcavity) that resonates light between the anode 111 and the cathode 115, that is between an upper surface of the reflective film of the anode 111 and a lower surface of the second film 118. Between the anode 111 and the cathode 115, light generated in the light emitting layer is repeatedly reflected, and light having a wavelength that matches the optical path length between the anode 111 and the cathode 115 is resonated and amplified. On the other hand, light having a wavelength that does not match the optical path length between the anode 111 and the cathode 115 is attenuated.

Here, the "optical path length" shall be calculated by using the desired wavelength of light emitted to the outside of the element and the refractive index of each layer at the desired wavelength of the light.

The optical path length between the anode 111 and the cathode 115 is, for example, set to be an integral multiple of the center wavelength of the light L generated by the light emitting layer contained in the functional layer 113. In that case, the light L emitted by the light emitting layer will be emitted to the outside of the organic EL element 100 as amplified as it is closer to the center wavelength, or as attenuated as it departs from the center wavelength. In this way, the light L emitted from the organic EL element 100, becomes to be one, of which the half value width of the light emission spectrum is narrow, and the color purity is improved.

In the organic EL element 100 of such a constitution, which has the conductive film of the present invention as the cathode 115, it is possible to reduce the wire resistance of the cathode 115 while a high light extraction efficiency is maintained in the second region, and favorable drive can be realized.

In the above embodiment, the organic EL element is exemplified as an optoelectronic device, however, the optoelectronic device to which the conductive film of the present invention is applied is not limited to an organic EL element.

The optoelectronic device according to the present invention may, for example, be a semiconductor laser. The semiconductor laser may be one having a known constitution. By employing the conductive film on the cathode which the semiconductor laser has, the cathode is made to have low resistance, and a semiconductor laser having an improved output can be obtained.

Further, the optoelectronic device of the present invention may be a light-receiving element such as an optical sensor or a solar cell. As the optical sensor and the solar cell, a kwon constitution such that holes and electrons generated in an active layer (light-receiving layer) depending on the intensity of light received by the active layer are transmitted to the cathode and the anode via the semiconductor layer, may be employed.

By employing the conductive film on the electrode (anode, cathode) of the optical sensor or the solar cell, the optical sensor has improved detection performance, or the solar cell has improved power generation efficiency.

Further, the conductive film and the optoelectronic device according to the present invention are useful for an application to e.g. a transparent display, in that the entire element has high transparency. Further, e.g. in an under-display camera or an under-display sensor, it is required to increase the transmittance of the display on the camera or the sensor, and the conductive film of the present invention is very useful.

Further, the conductive film of the present invention can be used as a patterned electrode or wiring, in addition to the optoelectronic device.

The preferred embodiments of the present invention are described above with reference to drawings. However, the present invention is by no means restricted to such examples. Various forms, combinations, etc. of the respective constituents indicated above are merely examples, and various changes are possible in accordance with requirements in design, etc., within the scope of the present invention.

EXAMPLES

Now, the present invention will be described in further detail with reference to Examples. However, it should be understood that the present invention is by no means restricted to such specific Examples.

<Evaluation Methods>

In the present embodiment, evaluation was made by the following methods.

[Measurement of Thermogravimetric Loss Rate of Fluorinated Polymer in Vacuum]

Measurement was conducted by using a vacuum differential thermobalance (manufactured by ADVANCE RIKO, Inc.:VPE-9000). 50 mg of the fluorinated polymer was put in a cell having an inner diameter of 7 mm, and the weight loss rate (%) of the fluorinated polymer when the temperature was increased from room temperature to 500° C. at a rate of 2° C. per minute in a degree of vacuum of $1\times10^{-3}$ Pa, to the initial weight (50 mg), was measured.

By this measurement, a temperature ($T_{d100}$) at which the weight loss rate became 100%, a temperature ($T_{d10}$) at which the weight loss rate became 10%, and a temperature ($T_{d90}$) at which the weight loss rate became 90%, were obtained.

[Measurement of Melting Point]

Measurement was conducted by using a differential scanning calorimeter (manufactured by NETZSCH, DSC 204 F1 Phoenix). 9 mg of the fluorinated polymer was put in a sample container, the heat capacity when the temperature was increased from −70° C. to 350° C. at a rate of 10° C. per minute was measured, and the melting point was determined from the obtained melting peak.

[Measurement of Surface Energy of Resin Film]

(Preparation of Contact Angle Measurement Sample)

On a 25 mm square silicon substrate, the fluorinated polymer was deposited at a deposition rate of 0.1 nm/sec to form a 100 nm resin film thereby to obtain a measurement sample.

(Evaluation of Surface Energy)

Using a contact angle meter (KRUSS, DSA25), on the resin film surface of the measurement sample horizontally placed, 2 μL each of water and n-hexadecane droplets were dropped to measure the contact angles.

The dispersion component $\gamma_S^d$ of surface energy $\gamma_S$ of the resin film and the polar component $\gamma_S^p$ of the surface energy $\gamma_S$ of the resin film were calculated from the obtained contact angles in accordance with the following formula (A), and the surface energy $\gamma_S$ of the resin form was calculated from the obtained values in accordance with the following formula (B).

$$\gamma_L(\cos\theta+1)/(2(\gamma_L^d)^{1/2})=(\gamma_S^p)^{1/2}\times(\gamma_L^p)^{1/2}/(\gamma_L^d)^{1/2}+(\gamma_S^d)^{1/2} \quad \text{(A)}$$

$\gamma_L$: surface energy of water or n-hexadecane $\gamma_L^d$: dispersion component of surface energy of water or n-hexadecane $\gamma_L^p$: polar component of surface energy of water or n-hexadecane θ: contact angle of water or n-hexadecane $$\gamma_S=\gamma_S^d+\gamma_S^p \quad \text{(B)}$$

$\gamma_S$: surface energy of resin film $\gamma_S^d$: dispersion component of surface energy of resin film $\gamma_S^p$: polar component of surface energy of resin film As the dispersion component, the polar component and the surface energy of water and n-hexadecane, values in the following Table 1 were employed.

TABLE 1

| | $\gamma^{Ld}$ (mN/m) | $\gamma^{LP}$ (mN/m) | $\gamma^{L}$ (mN/m) |
|---|---|---|---|
| Water | 29.1 | 43.7 | 72.8 |
| n-Hexadecane | 27.6 | 0 | 27.6 |

(Measurement of $CF_3$ Concentration)

The content (mmol/g) of the trifluoromethyl moiety was obtained in accordance with the following formula.

$$\text{(Content of trifluoromethyl moiety)}=[NCF_3/MA]\times1{,}000$$

$NCF_3$: the sum of products of the number of moles of the trifluoromethyl moiety constituting each type of units constituting the fluorinated polymer, and the mole fraction of the units to all units.

MA: the sum of products of the total atomic weight of all atoms constituting each type of units constituting the fluorinated polymer, and the mole fraction of the units to all units.

The number of moles of the trifluoromethyl moiety, total atomic weight of all atoms constituting each type of units, mole fraction, etc. used for the above formula, were calculated by the mole fraction of the constituting units and the amount of terminals of the fluorinated polymer, obtained by subjecting the fluorinated polymer to NMR analysis and IR analysis.

(Measurement of Fluorine Atom Content)

The fluorine atom content (mass %) was obtained in accordance with the following formula.

$$\text{(Fluorine atom content)}=[19\times NF/MA]\times100$$

NF: the sum of products of the total atomic weight of fluorine atoms constituting each type of units constituting the fluorinated polymer, and the mole fraction of the units to all units.

MA: the sum of products of the total atomic weight of all atoms constituting each type of units constituting the fluorinated polymer, and the mole fraction of the units to all units.

The atomic weight of fluorine atoms, total atomic weight of all atoms constituting each type of units, mole fraction, etc., used for the above formula, were calculated by the mole fraction of the constituting units and the amount of terminals of the fluorinated polymer, obtained by subjecting the fluorinated polymer to NMR analysis and IR analysis.

<Synthesis of Fluorinated Polymer>

The fluorinated polymer used for evaluation was synthesized as follows.

Synthesis Example 1

30 g of perfluoro(3-butenyl vinyl ether) (BVE), 30 g of 1,1,1,2,2,3,3,4,4,5,5,6,6-tridecafluorohexane (1H-PFH), 0.5 g of methanol and 0.44 g of diisopropyl peroxydicarbonate (IPP) were weighed and put into a glass reactor having an internal capacity of 50 ml. The system in the reactor was replaced with high purity nitrogen gas, and the reactor was heated to 40° C. to conduct polymerization for 24 hours.

From the obtained solution, the solvent was removed under 666 Pa (absolute pressure) at 50° C. to obtain 28 g of a polymer.

Then, the obtained polymer was heated in an oven at 300° C., and treated by the method disclosed in JP-A-H11-152310, paragraph [0040] with fluorine gas to replace the unstable terminal group with a —$CF_3$ group to obtain fluorinated polymer A.

The obtained fluorinated polymer A was put in a raw material charge portion of a glass tube type sublimation purification apparatus, and the pressure in the interior of collecting portions was reduced to $3.0\times10^{-3}$ Pa. The raw material charge portion was gradually heated to 330° C. to sublimate the fluorinated polymer A. In the sublimation purification apparatus, the collecting portions, from the side closer to the charge portion, were heated at set temperatures of 310° C., 280° C., 250° C. and 200° C.

Among such collecting portions, substances precipitated in the collecting portions at the set temperatures of 200° C., 250° C., 280° C. and 310° C. were recovered to obtain 2 g of purified fluorinated polymer A1.

Synthesis Example 2

A polymer produced in the same manner as in Synthesis Example 1 was heated in an oven at 300° C., dipped in methanol and heated in an oven at 75° C. for 20 hours to replace the terminal group with a methyl ester group to obtain fluorinated polymer B.

In the same manner as in Synthesis Example 1, the fluorinated polymer B was sublimated. Substances precipitated in the collecting portions at set temperatures of 200° C., 250° C. and 280° C. were recovered to obtain 2 g of purified fluorinated polymer B1.

Synthesis Example 3

Into a stainless steel autoclave having an internal capacity of 1,006 mL, 152.9 g of perfluoro(propyl vinyl ether) (PPVE), 805 g of AC2000 (manufactured by AGC Inc.), 2.40 g of methanol and 1.15 g of azobisisobutyronitrile (AIBN) were put, and the autoclave was freeze-deaerated with liquid nitrogen.

The temperature of the autoclave was increased to 70° C., and 56.3 g of tetrafluoroethylene (TFE) was introduced into the autoclave to initiate polymerization. Since the pressure in the autoclave decreased as the polymerization proceeded, TFE was continuously supplied to conduct polymerization while the temperature and the pressure in the autoclave were kept constant. 5 Hours after initiation of the polymerization, the autoclave was cooled to terminate the polymerization, and the gas in the system was discharged to obtain a reaction solution.

800 g of methanol was added to the reaction solution and mixed to precipitate the polymer dissolved in the reaction solution, followed by phase separation, and the lower layer in which the polymer was dispersed was recovered. The obtained polymer dispersion was warm air-dried at 80° C. for 16 hours and then vacuum dried at 100° C. for 16 hours to obtain a polymer.

The composition of the obtained polymer was PPVE units:TFE units=14:86 (mol %).

Then, the obtained polymer was heated in an oven at 330° C., dipped in methanol and heated in an oven at 75° C. for 40 hours to replace the terminal group with a methyl ester group to obtain fluorinated polymer C.

In the same manner as in Synthesis Example 1, the fluorinated polymer C was sublimated. Substances precipitated in the collecting portion at a set temperature of 280° C. were recovered to obtain 4 g of purified fluorinated polymer $C_1$.

Synthesis Example 4

In the same manner as in Synthesis Example 3 except that 78.9 g of PPVE, 767 g of AC2000, 4.23 g of methanol, 1.27 g of AIBN and 48.4 g of TFE were used, polymer was obtained.

The composition of the obtained polymer was PPVE units:TFE units=9:91 (mol %).

Then, in the same manner as in Synthesis Example 3, the terminal group of the polymer was replaced with a methyl ester group to obtain fluorinated polymer D.

In the same manner as in Synthesis Example 1, the fluorinated polymer D was sublimated. Substances precipitated in the collection portions at set temperatures of 250° C. and 280° C. were recovered to obtain 4 g of fluorinated polymer D1.

Synthesis Example 5

In the same manner as in Synthesis Example 3 except that 57.9 g of PPVE, 4.13 g of methanol and 1.24 g of AIBN were used, polymer was obtained.

The composition of the obtained polymer was PPVE units:TFE units=6:94 (mol %).

Then, in the same manner as in Synthesis Example 4, the terminal group of the polymer was replaced with a methyl ester group to obtain fluorinated polymer E.

In the same manner as in Synthesis Example 1, the fluorinated polymer E was sublimated. Substances precipitated in the collection portions at set temperatures of 200° C., 250° C. and 280° C. were recovered to obtain 5 g of purified fluorinated polymer E1.

Synthesis Example 6

A jacketed polymerization vessel (formed of stainless steel) having an internal capacity of 1.351 L was deaerated, and into the polymerization vessel, 649 g of 1,1,2,2-tetrafloroethyl-2,2,2-trifluoroethyl ether (AE-3000 manufactured by AGC Inc.), 152 g of perfluoropropyl vinyl ether (PPVE), 109 g of tetrafluoroethylene (TFE) and 15.5 g of methanol weighed were put.

While the temperature of the polymerization vessel was kept at 60° C., 18.9 mL of a 0.79 mass % solution (solvent: AE-3000) of t-butyl peroxypivalate (PBPV) was charged to initiate polymerization.

During the polymerization, since the polymerization pressure decreased as the polymerization proceeded, TFE was continuously supplied to the polymerization vessel so that the polymerization pressure would be substantially constant. The polymerization pressure was kept under 1.04±0.04 MPaG (gauge pressure).

The polymerization was terminated at a point when the amount of TFE introduced reached 121 g to obtain polymer.

The composition of the obtained polymer was PPVE units:TFE units=4:96 (mol %).

Then, the obtained polymer was heated in an oven at 330° C., and in the same manner as in Synthesis Example 1, the terminal group of the polymer was replaced with a —$CF_3$ group to obtain fluorinated polymer F.

Using 20 g of the obtained polymer F, in the same manner as in Synthesis Example 1, the fluorinated polymer F was sublimated. Substances precipitated in the collecting portions at set temperatures of 250° C. and 280° C. were recovered to obtain 2 g of purified fluorinated polymer F1.

Further, 20 g of the obtained fluorinated polymer F was put in a pressure container of a supercritical extraction apparatus and subjected to supercritical extraction by carbon dioxide.

Extraction was conducted under conditions (condition 1) at an extraction temperature of 40° C. under an extraction pressure of 30 MPa at a carbon dioxide flow rate of 30 ml/min to obtain 0.2 g of an extract, and then extraction was conducted under conditions (condition 2) at an extraction temperature of 80° C. under an extraction pressure of 60 MPa using as the entrainer AC-2000 (manufactured by AGC Inc.) at a proportion of 10 vol % relative to carbon dioxide to obtain 1.4 g of an extract.

The extract obtained by supercritical extraction was taken as fluorinated polymer F2.

Synthesis Example 7

The terminal group of a polymer produced in the same manner as in Synthesis Example 6 was replaced with a methyl ester group under the same conditions as in Synthesis Example 3 to obtain fluorinated polymer G.

In the same manner as in Synthesis Example 1, the fluorinated polymer G was sublimated. Substances precipitated in the collection portion at a set temperature of 250° C. were recovered to obtain 4 g of purified fluorinated polymer G1.

Synthesis Example 8

In the same manner as in Synthesis Example 6 except that 701 g of AE-3000, 57 g of PPVE, 108 g of TFE, 35.7 g of methanol and 18.9 mL of a 0.53 mass % solution (solvent: AE-3000) of PBPV were used, polymer was obtained.

The composition of the obtained fluorinated polymer was PPVE units:TFE units=2:98 (mol %).

Then, in the same manner as in Synthesis Example 1, the terminal group of the polymer was replaced with a —$CF_3$ group to obtain fluorinated polymer H.

In the same manner as in Synthesis Example 1, the fluorinated polymer H was sublimated. Substances precipitated in the collecting portion at a set temperature of 280° C. were recovered to obtain 4 g of purified fluorinated polymer H1.

Synthesis Example 9

The terminal group of a polymer produced in the same manner as in Synthesis example 8 was replaced with a methyl ester group under the same conditions as in Synthesis Example 3 to obtain fluorinated polymer I.

In the same manner as in Synthesis Example 1, the fluorinated polymer I was sublimated. Substances precipitated in the collection portions at set temperatures of 250° C. and 280° C. were recovered to obtain 4 g of purified fluorinated polymer 11.

[Commercial Fluorinated Polymers]

As commercial fluorinated polymers, the following materials were subjected to evaluation.

Fluon PTFE L173JE (manufactured by AGC Inc.): tetrafluoroethylene polymer

Fluon PFA P-63 (manufactured by AGC Inc.): tetrafluoroethylene/perfluoropropyl vinyl ether copolymer TEFLON AF 1600 (manufactured by DuPont): tetrafluoroethylene/perfluoro(2,2-dimethyl-1,3-dioxole) copolymer kynar 301F (manufactured by ARKEMA): vinylidene fluoride polymer kynar 720 (manufactured by ARKEMA): vinylidene fluoride polymer Further, 50 g of TEFLON AF 1600 was weighed and sublimated in the same manner as in Synthesis Example 1, and substances precipitated in the collecting portion at set temperatures of 250° C. and 280° C. were recovered to obtain 2 g of purified fluorinated polymer J1.

<Evaluation>

The obtained fluorinated polymers were subjected to the following evaluations 1 to 4.

Evaluation 1: Chamber Pressure Change at the Time of Deposition 0.1 g of the fluorinated polymer was put in a vacuum deposition apparatus, the pressure in the chamber was reduced to $10^{-4}$ Pa or lower, and the fluorinated polymer was deposited in a thickness of 200 nm at a deposition rate of 0.1 nm/sec. On that occasion, the pressure in the chamber was monitored, and the maximum value of the pressure at the time of deposition was measured. The pressure increase ratio was determined from the measured value in accordance with the following formula.

(Chamber pressure increase ratio at the time of deposition)=(maximum pressure during deposition)/(initial pressure before deposition)

A fluorinated polymer with the chamber pressure increase ratio of two times or less was evaluated as "favorable" and a fluorinated polymer with the increase ratio of higher than 2 times was evaluated as "poor".

A fluorinated polymer evaluated as poor in this evaluation was not any more subjected to the following evaluation of the conductive film, since such a polymer might contaminate the chamber.

Evaluation 2: Evaluation 1 of Patterning Property of Conductive Film (Preparation of Transmittance Measurement Sample)

A 25 mm×25 mm×0.525 mm quartz substrate was used. On the plan-view center of the quartz substrate, using a metal mask having 21 mm×5 mm rectangular openings, the fluorinated polymer was deposited to prepare a quartz substrate having a resin film.

Deposition of the fluorinated polymer was conducted at a deposition rate of 0.1 nm/sec. Further, deposition of the fluorinated polymer was conducted until the film thickness reached 10 nm as measured by a film thickness meter attached to the deposition apparatus.

Then, on the entire quartz substrate having a resin film, Ag was deposited from above the resin film without using a mask to prepare a conductive film sample for transmittance measurement.

Deposition of Ag was conducted at a deposition rate of 0.05 nm/sec. Further, deposition of Ag was conducted until the film thickness reached 15 nm as measured by a film thickness meter attached to the deposition apparatus.

(Measurement of Transmittance)

The transmittance of the prepared conductive film sample was measured by using a spectrophotometer (manufactured by Shimadzu Corporation, model: UV-3600 Plus). From the obtained results, it was judged that the higher the transmittance was, the better the patterning property was (the easier the patterning would be).

Ex. 1 to 11

Using the above fluorinated polymers A1 to J1, resin films were formed, which were subjected to the above evaluations 1 and 2.

Ex. 12

In the same manner as in Ex. 1 except that Fluon PTFE L173JE was used as the fluorinated polymer to form a resin film, evaluations were conducted.

Since the chamber pressure increase at the time of deposition was remarkably high in evaluation 1, no other evaluation was conducted.

Ex. 13

In the same manner as in Ex. 1 except that Fluon PFA P-63 was used as the fluorinated polymer to form a resin film, evaluations were conducted.

Since the chamber pressure increase at the time of deposition was remarkably high in evaluation 1, no other evaluation was conducted.

Ex. 14

In the same manner as in Ex. 1 except that TEFLON AF 1600 was used as the fluorinated polymer to form a resin film, evaluations were conducted.

Since the chamber pressure increase at the time of deposition was remarkably high in evaluation 1, no other evaluation was conducted.

Ex. 15

In the same manner as in Ex. 1 except that kynar 301F was used as the fluorinated polymer to form a resin film, evaluations were conducted.

Since the chamber pressure increase at the time of deposition was remarkably high in evaluation 1, no other evaluation was conducted.

Ex. 16

In the same manner as in Ex. 1 except that kynar 720 was used as the fluorinated polymer to form a resin film, evaluations were conducted.

Since the chamber pressure increase at the time of deposition was remarkably high in evaluation 1, no other evaluation was conducted.

Ex. 17

Evaluations were conducted in the same manner as in Ex. 1 except that the following 3-(4-biphenyl)-4-phenyl-5-tert-butylphenyl-1,2,4-triazole (hereinafter referred to as TAZ) was used instead of the fluorinated polymer to form a resin film. TAZ is a polycyclic organic semiconductor used in Patent Document 1 (U.S. patent Ser. No. 10/270,033).

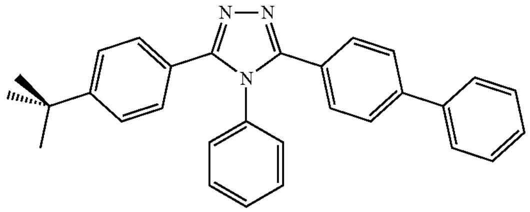

Ex. 18

Evaluations were conducted in the same manner as in Ex. 1 except that the following N-(diphenyl-4-yl)-9,9-dimethyl-N-(4-(9-phenyl-9H-carbazol-3-yl)phenyl)-9H-fluorene-2-a mine (hereinafter referred to as HT211) was used instead of the fluorinated polymer to form a resin film.

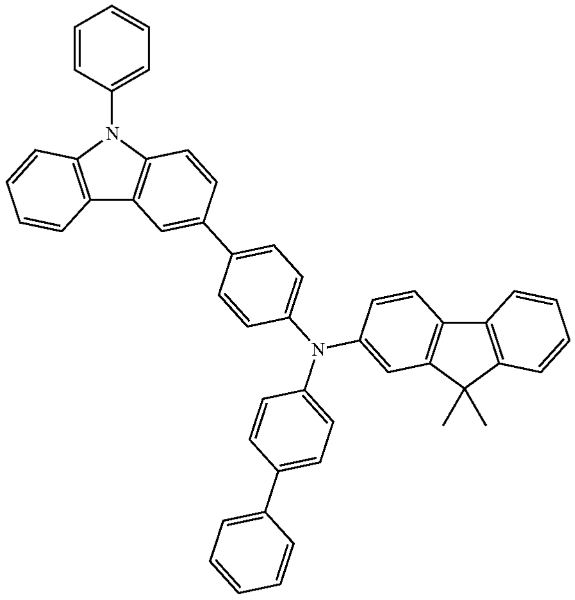 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21]

Reference Example 1

A Ag film was formed in a film thickness of 15 mm on a quartz substrate, and evaluation 2 was conducted.

The film thickness of the Ag film in Reference Example 1 is the same as the film thickness of the metal film formed at a position not overlapping with the resin film in evaluation 2 in Ex. 1 to 18.

Reference Example 2

A Ag film was formed in a film thickness of 2 nm on a quartz substrate, and evaluation 2 was conducted.

Among the above Ex. 1 to 18, Ex. 1 to 11 correspond to Examples of the present invention, and Ex. 12 to 18 correspond to Comparative Examples. The evaluation results are shown in Tables 2 and 3. Table 2 illustrates physical properties of the materials of the rein film, and Table 3 illustrates the evaluation results. In Tables, "-" means that no data are present.

TABLE 2

| | Resin film material | 100% Thermogravimetric loss temperature (° C.) | Thermogravimetric loss temperature range (° C.) | Surface energy (mN/m) | Melting point (° C.) | $CF_3$ concentration (mmol/g) | Fluorine atom content (%) |
|---|---|---|---|---|---|---|---|
| Ex. 1 | A1 | 345 | 120 | 16 | — | 0.25 | 68 |
| Ex. 2 | B1 | 325 | 90 | 17 | — | 0 | 68 |
| Ex. 3 | C1 | 327 | 34 | 15 | 170 | 1.1 | 75 |
| Ex. 4 | D1 | 315 | 42 | 15 | 230 | 0.8 | 75 |
| Ex. 5 | E1 | 326 | 90 | 15 | 262 | 0.55 | 75 |
| Ex. 6 | F1 | 339 | 48 | 11 | 270 | 0.55 | 76 |
| Ex. 7 | F2 | 390 | 95 | 11 | 272 | 0.55 | 76 |
| Ex. 8 | G1 | 280 | 25 | 14 | 267 | 0.38 | 76 |
| Ex. 9 | H1 | 320 | 32 | 12 | 288 | 0.35 | 76 |
| Ex. 10 | I1 | 340 | 46 | 16 | 290 | 0.2 | 76 |
| Ex. 11 | J1 | 325 | 50 | 11 | — | 6.7 | 65 |
| Ex. 12 | fluon PTFE | 500< | 200< | — | — | 0 | 76 |
| Ex. 13 | fluon PFA | 500< | 200< | — | — | 0.11 | 76 |
| Ex. 14 | TEFLON AF | 500< | 200< | — | — | 6.7 | 65 |
| Ex. 15 | Kynar 301F | 500< | 200< | — | — | 0 | 59 |
| Ex. 16 | Kynar 720 | 500< | 200< | — | — | 0 | 59 |
| Ex. 17 | TAZ | — | — | 33 | — | 0 | 0 |
| Ex. 18 | HT211 | — | — | 30 | — | 0 | 0 |

TABLE 3

| | Resin film material | Pressure increase ratio | Light transmittance at second region (%) B (436 nm) | G (546 nm) | R (700 nm) | NIR (940 nm) |
|---|---|---|---|---|---|---|
| Ex. 1 | A1 | 2 | 99 | 99 | 99 | 99 |
| Ex. 2 | B1 | 1.7 | 70 | 89 | 97 | 98 |
| Ex. 3 | C1 | 1.2 | 96 | 99 | 100 | 99 |
| Ex. 4 | D1 | 1.2 | 87 | 97 | 99 | 99 |
| Ex. 5 | E1 | 1.6 | 75 | 94 | 99 | 99 |
| Ex. 6 | F1 | 1.3 | 69 | 92 | 98 | 99 |
| Ex. 7 | F2 | 1.8 | 71 | 93 | 99 | 99 |
| Ex. 8 | G1 | 1 | 58 | 82 | 95 | 97 |
| Ex. 9 | H1 | 1.2 | 51 | 77 | 95 | 98 |
| Ex. 10 | I1 | 1.4 | 37 | 50 | 77 | 92 |
| Ex. 11 | J1 | 1.4 | 91 | 97 | 98 | 99 |
| Ex. 12 | fluon PTFE | 25 | — | — | — | — |
| Ex. 13 | fluon PFA | 45 | — | — | — | — |
| Ex. 14 | TEFLON AF | 34 | — | — | — | — |
| Ex. 15 | Kynar 301F | 111 | — | — | — | — |
| Ex. 16 | Kynar 720 | 200 | — | — | — | — |
| Ex. 17 | TAZ | — | 66 | 50 | 35 | 22 |
| Ex. 18 | HT211 | — | 44 | 27 | 17 | 16 |
| Ref. Ex. 1 | — | — | 39 | 24 | 21 | 24 |
| Ref. Ex. 2 | — | — | 74 | 88 | 99 | 99 |

Figure 10:
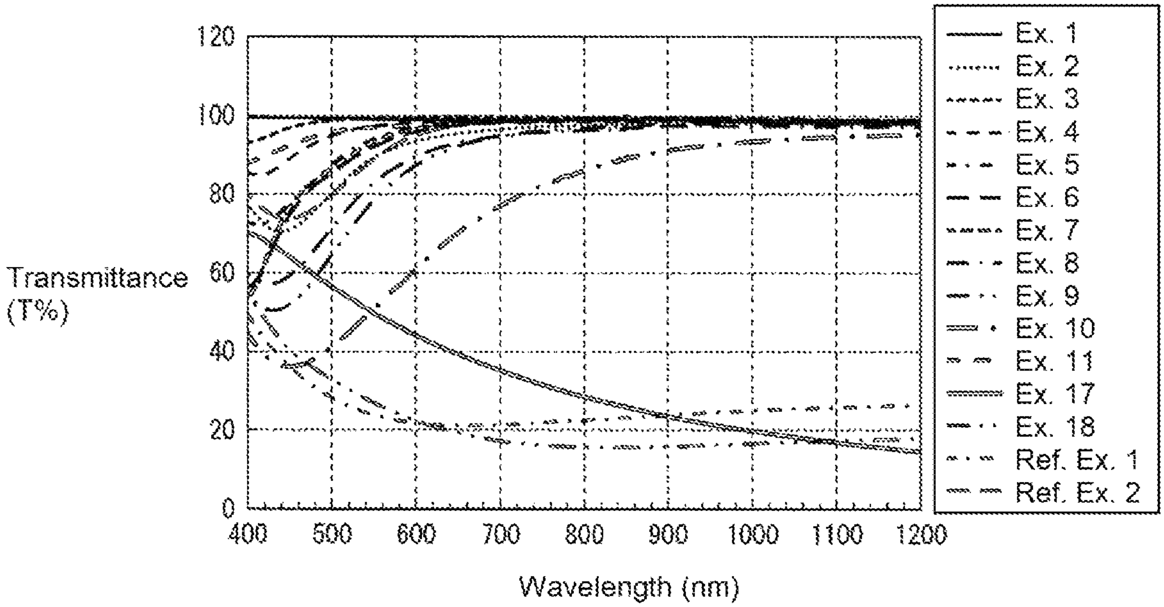
FIG. 10 is a graph illustrating the results in Examples.

Further, the results of evaluation 2 are shown in FIG. 10.

It was found from the results of evaluations that in Ex. 1 to 11, no chamber pressure increase at the time of deposition was observed, and no depolymerization, thermal decomposition, nor generation of an out gas was observed.

Further, it was found that in Ex. 1 to 11, the light transmittance at the second region in the prepared sample is high as compared with the light transmittance in Reference Example 1. Accordingly, it was found that in Ex. 1 to 11, patterning between the first region and the second region was conducted.

Further, in Ex. 1 to 11, the samples had a high transmittance particularly in a long wavelength region including a near infrared region, and thus such samples were confirmed to be very useful for applications to under-display sensors having an optical authentication sensor employing near infrared rays mounted.

Particularly in Ex. 1 to 5, the light transmittance in a wavelength range of 450 nm or more was higher than in Reference Example 2 (Ag 2 nm), and in Ex. 1, 3 and 4, the light transmittance was higher in all the wavelength range measured than in Reference Example 2.

Whereas in Ex. 12 to 16, a chamber pressure increase at the time of deposition was confirmed, and thus it was found that deposition would be accompanied by depolymerization, thermal decomposition, and generation of an out gas, such being substantially unsuitable for preparation of the conductive film according to the present embodiment.

Further, it was found that in Ex. 17 and 18, although the light transmittance at the second region in the prepared sample is high as compared with the light transmittance in Reference Example 1, the light transmittance is low as compared with Ex. 1 to 11. That is, it was found that the resin films formed in Ex. 17 and 18 are likely to have a metal film readily formed on their upper surface, and patterning with a high contrast between the first region and the second region is hardly conducted. It was found that particularly the transmittance in a long wavelength region including the near infrared region is low, and thus the patterning property is significantly low as compared with the conductive film according to the present embodiment.

Evaluation 3: Evaluation 2 of Patterning Property of Conductive Film (Preparation of Transmittance Measurement Sample)

A 25 mm×25 mm×0.525 mm quartz substrate was used. On the entire surface of the quartz substrate, Ag was deposited without using a mask to form a second film.

Deposition of Ag was conducted at a deposition rate of 0.05 nm/sec. Further, deposition of Ag was conducted until the film thickness reached 10 nm as measured by a film thickness meter attached to the deposition apparatus.

Then, on the quartz substrate having Ag deposited on the entire surface, on the plan-view center of the substrate, using a metal mask having 21 mm×5 mm rectangular openings, the fluorinated polymer was deposited to prepare a quartz substrate having a resin film.

Deposition of the fluorinated polymer was conducted at a deposition rate of 0.1 nm/sec. Further, deposition of the fluorinated polymer was conducted until the film thickness reached 50 nm as measured by a film thickness meter attached to the deposition apparatus.

Then, on the quartz substrate having the Ag entirely deposited film and the resin film, Ag or Mg was deposited over the entire surface from above the resin film without using a mask, to prepare a conductive film sample for transmittance measurement.

Deposition of Ag or Mg was conducted at a deposition rate of 0.05 nm/sec. Further, deposition of Ag or Mg was conducted until the film thickness reached 15 nm as measured by a film thickness meter attached to the deposition apparatus.

(Measurement of Transmittance)

The transmittance of the prepared conductive film sample was measured by using a spectrophotometer (manufactured by Shimadzu Corporation, model: UV-3600 Plus). From the obtained results, it was judged that the higher the transmittance was, the better the patterning property was.

Ex. 19

Using the above fluorinated polymer D1, a resin film was formed, and the above evaluation 3 was conducted.

Ex. 20

Evaluation was conducted in the same manner as in Ex. 19 except that a resin film was formed y using TAZ instead of the fluorinated polymer.

Reference Example 3

On a quartz substrate, a Ag film was formed in a film thickness of 10 nm and then a Ag or Mg film was formed in a film thickness of 15 nm, and evaluation 3 was conducted.

The film thickness of the Ag or Mg film in Reference Example 3 was the same as the film thickness of the metal film formed at a position not overlapping with the resin film in Evaluation 3 in Ex. 19 and 20.

Ex. 19 corresponds to an Example of the present invention, and Ex. 20 corresponds to a Comparative Example. The evaluation results are shown in Table 4.

TABLE 4

| | | | Light transmittance at second region (%) | | | |
|---|---|---|---|---|---|---|
| | Resin film material | First film material | B (436 nm) | G (546 nm) | R (700 nm) | NIR (940 nm) |
| Ex. 19 | D1 | Ag | 51 | 23 | 28 | 39 |
| | | Mg | 54 | 23 | 27 | 37 |
| Ex. 20 | TAZ | Ag | 36 | 8 | 6 | 10 |
| Ref. Ex. 3 | — | Ag | 40 | 26 | 18 | 12 |
| | | Mg | 26 | 26 | 25 | 21 |

Figure 11:
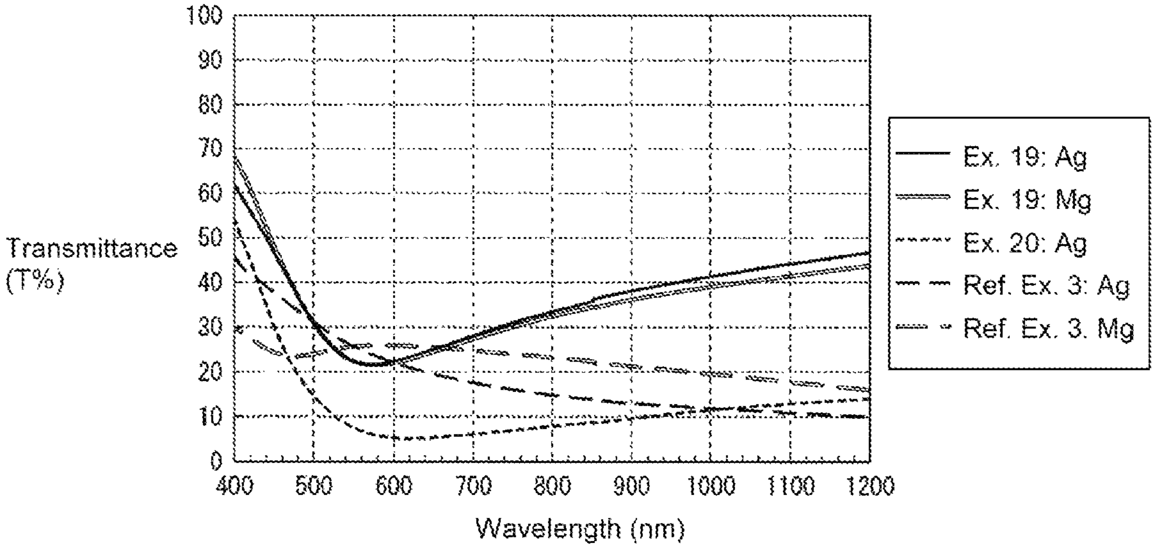
FIG. 11 is a graph illustrating the results in Examples.

The results of evaluation 3 are shown in FIG. 11.

It is found that in Ex. 19, the light transmittance at the second region of the prepared sample was high as compared with the light transmittance in Reference Example 3. Accordingly, it was found that in Ex. 19, patterning between the first region and the second region was conducted. Further, it was confirmed that in Ex. 19, the sample had a high transmittance in a long wavelength region including a near infrared region, and thus such sample was confirmed to be very useful for applications to under-display sensors having an optical authentication sensor employing near infrared rays mounted.

Whereas in Ex. 20, it was found that the light transmittance at the second region of the prepared sample was equal to or less than the light transmittance in Reference Example 1. That is, it was found that a metal film tends to be readily formed on the upper surface of the resin film formed in Ex. 20 than the resin film formed in Ex. 19, and patterning between the first region and the second region tends to be difficult.

Evaluation 4: Evaluation 3 of Patterning Property of Conductive Film (Preparation 1 of Conductive Film Sample: For Total Light Transmittance Measurement)

(Step 1)

On the entire surface of a 25 mm×25 mm×0.525 mm quartz substrate, Ag was deposited without using a mask to form a second film.

Deposition of Ag was conducted at a deposition rate of 0.05 nm/sec. Further, deposition of Ag was conducted until the film thickness reached 30 nm as measured by a film thickness meter attached to the deposition apparatus.

(Step 2)

Then, on the substrate having Ag deposited on its entire surface, on the plan-view center of the substrate, using a metal mask having 21 mm×5 mm rectangular openings, the fluorinated polymer was deposited to prepare a quartz substrate having a resin film.

Deposition of the fluorinated polymer was conducted at a deposition rate of 0.1 nm/sec. Further, deposition of the fluorinated polymer was conducted until the film thickness reached 50 nm as measured by a film thickness meter attached to the deposition apparatus.

(Step 3)

Then, on the quartz substrate having a resin film prepared in Step 2, Ag was deposited on the entire surface from above the resin film without using a mask to prepare a conductive film sample for total light transmittance measurement. On the prepared conductive film sample, the region having no resin film formed thereon corresponds to the "the first region" in the present invention, and the region having the resin film formed thereon corresponds to "the second region" in the present invention.

Deposition of Ag was conducted at a deposition rate of 0.05 nm/sec. Further, deposition of Ag was conducted until the film thickness reached 70 nm as measured by a film thickness meter attached to the deposition apparatus.

(Preparation 2 of Conductive Film Sample: For Film Thickness Measurement)

A conductive film sample for film thickness measurement was prepared in the same manner as in Preparation 1 of conductive film sample except that a 25 mm×25 mm silicon substrate was used instead of the quartz substrate.

Further, Step 1 was conducted on the silicon substrate to prepare a reference sample 1 having only the second film formed thereon, and Step 1 and Step 2 were conducted on the silicon substrate to prepare a reference sample 2 having the second film and the resin film formed thereon.

(Total Light Transmittance Measurement)

With respect to the conductive film sample for total light transmittance measurement, the total light transmittance at the second region was measured by a haze meter (manufactured by Suga Test Instruments Co., Ltd., model: HZ-V3, measurement light: illuminant D65).

(Film Thickness Measurement)

At the first region of the conductive film sample for film thickness measurement, a scar extending from the surface of the first film to the silicon substrate was made, and the film thickness from the surface of the first film to the surface of the silicon substrate (total film thickness at the first region) was measured.

Similarly, at the second region of the conductive film sample for film thickness measurement, a scar extending from the surface of the first film to the silicon substrate was made, and the film thickness from the surface of the first film to the surface of the silicon substrate (total film thickness at the second region) was measured.

Similarly, on the reference sample 1, a scar extending from the surface of the second film to the silicon substrate was made, and the film thickness from the surface of the second film to the surface of the silicon substrate (film thickness of the second film of the reference sample 1) was measured.

Similarly, at the second region of the reference sample 2, a scar extending from the surface of the resin film to the silicon substrate was made, and the film thickness from the surface of the resin film to the surface of the silicon substrate (total film thickness of the second film and the resin film of the reference sample 2) was measured.

The film thickness was measured by using a stylus surface measurement apparatus (manufactured by Bruker AXS, Dektak XT).

The film thickness a of the first film at the first region and the film thickness b of the first film at the second region were calculated in accordance with the following formulae.

Film thickness a (nm) of first film at first region=[total film thickness (nm) at first region]−[film thickness (nm) of second film of reference sample 1]

Film thickness b (nm) of first film at second region=[total film thickness (nm) at second region]−[total film thickness (nm) of second film and resin film of reference sample 2]

(Evaluation of Patterning Property)

As to whether patterning using the resin film was possible or not, evaluation was made based on the following standards, with A and B evaluated as good, and C and D evaluated as poor.

A: film thickness b to film thickness a being 0% or more and 10% or less

B: film thickness b to film thickness a being more than 10% and 50% or less

C: film thickness b to film thickness a being more than 50% and 90% or less

D: film thickness b to film thickness a being more than 90% and 100% or less

Ex. 21

A resin film was formed by using the fluorinated polymer A1, and the above evaluation 4 was conducted.

Reference Example 4

On a quartz substrate, a Ag film was formed in a film thickness of 30 nm and then a Ag film was formed in a film thickness of 70 nm. Using the obtained sample, total light transmittance measurement was conducted. The film thickness of the Ag film in Reference Example 4 was the same as the film thickness of the metal film formed at the first region on the conductive film sample prepared in Ex. 21.

Ex. 21 corresponds to an Example of the present invention.

As a result of evaluation, the total light transmittance at the second region in Ex. 21 was 27%.

The film thickness a of the first film at the first region in Ex. 21 was 68 nm, the film thickness b of the first film at the second region was 0 nm, and the result of evaluation of patterning property was A.

Further, the total light transmittance in Reference Example 4 was 0.6%.

From the measurement results of the total light transmittances at the second region of the conductive film sample in Ex. 21 and the sample in Reference Example 4, it was found that the conductive film sample in Ex. 21 has a higher light transparency at the second region than at the first region.

Further, from the results of the film thickness measurement in Ex. 21, it was confirmed that on the conductive film sample in Ex. 21, formation of the first film at the second region was suppressed.

It was found from these results that in the conductive film sample in Ex. 21, patterning between the first region and the second region could be favorably conducted.

Evaluation 5: Confirmation of Patterning Shape of Conductive Film (Preparation of Conductive Film: For Observation with Microscope)

A 25 mm×25 mm×0.525 mm quartz substrate was used. On the quartz substrate, the fluorinated polymer was deposited by using a metal mask having circular openings having a diameter of 30 μm arranged at 60 μm intervals in the X-axis direction and in the Y-axis direction on a plane, to prepare a quartz substrate having a resin film.

Deposition of the fluorinated polymer was conducted at a deposition rate of 0.1 nm/sec. Further, deposition of the fluorinated polymer was conducted until the film thickness reached 30 nm as measured by a film thickness meter attached to the deposition apparatus.

Then, on the quartz substrate having a resin film, Ag to be the first film was deposited on the entire surface from above the resin film without using a mask to prepare a conductive film sample for confirmation of patterning shape.

Deposition of Ag was conducted at a deposition rate of 0.5 nm/sec. Further, deposition of Ag was conducted until the film thickness reached 70 nm as measured by a film thickness meter attached to the deposition apparatus.

(Observation with Microscope and Measurement of Pattern Size)

The prepared conductive film sample for confirmation of patterning shape was observed with a digital microscope (manufactured by Keyence Corporation, model: VHX-2000). The diameter of the region B was measured.

Ex. 22

A resin film was formed by using the fluorinated polymer A1, and the above evaluation 5 was conducted.

Ex. 23

A resin film was formed by using the fluorinated polymer $C_1$, and the above evaluation 5 was conducted.

Ex. 24

A resin film was formed by using the fluorinated polymer D1, and the above evaluation 5 was conducted.

Reference Example 5

With respect to the metal mask used for deposition of the fluorinated polymer in Evaluation 5, the diameter of the opening was measured in the same manner as measurement of the pattern size in evaluation 5. The measured value was 27 μm.

Figure 13:
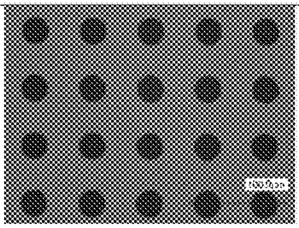
FIG. 13 shows microscope images of Examples 22, 23 and 24.
Figure 13:
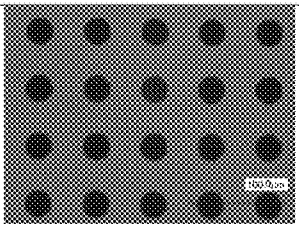
Figure 13:
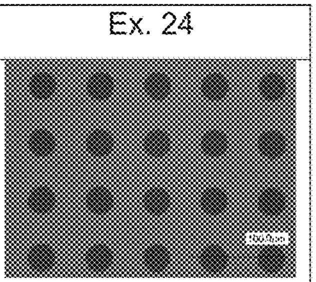

The microscope images and the results of measurement of the diameter (unit: μm) of the region B are shown in FIG. 13.

As shown in FIG. 13, the conductive film obtained by using the fluorinated polymer has a region B reflecting the design of the metal mask, and has precise patterning at a level of several tens μm.

Evaluation 6: Evaluation of Sheet Resistance of Conductive Film (Preparation of Conductive Film: For Sheet Resistance Measurement)

(Step 1)

On the entire surface of a 75 mm×75 mm quartz substrate, Mg:Ag was deposited without using a mask to form a second film having a film thickness of 15 nm. Deposition was conducted while the Mg:Ag volume ratio was adjusted to be 1:10. The total deposition rate of Mg and Ag was 0.1 nm/sec.

(Step 2)

Then, on the quartz substrate having Mg:Ag deposited on its entire surface, the fluorinated polymer was deposited by using a metal mask having circular openings having a diameter of 150 μm arranged at 250 μm intervals in the X-axis direction and in the Y-axis direction on a plane, to prepare a quartz substrate having a resin film. Deposition of the fluorinated polymer was conducted at a deposition rate of 0.1 nm/sec, until the film thickness reached 50 nm as measured by a film thickness meter attached to the deposition apparatus.

(Step 3)

Then, on the quartz substrate having a resin film prepared in step 2, Mg:Ag to be the first film was deposited on the entire surface from above the resin film without using a mask, to prepare a conductive film sample for sheet resistance measurement. Deposition was conducted while the Mg:Ag volume ratio was adjusted to be 1:10, until the film thickness reached 15 nm as measured by a film thickness meter attached to the deposition apparatus. The total deposition rate of Mg and Ag was 0.1 nm/sec.

(Preparation of Conductive Film Differing in Film Thickness of First Film)

In the same manner as the above Steps 1 to 3, conductive film samples for sheet resistance measurement having a first film with a film thickness of 45 nm and 75 nm in Step 3 were prepared.

(Measurement of Sheet Resistance)

The sheet resistance of the prepared conductive film sample for sheet resistance measurement was measured by a low resistivity meter (manufactured by Nittoseiko Analytech Co., Ltd., Loresta). A four-point probe of Loresta was pressed from above the conductive film sample to measure the sheet resistance.

Ex. 25

A resin film was formed by using the fluorinated polymer D1, and the above evaluation 6 was conducted.

Reference Example 6

On the entire surface of a 75 mm×75 mm quartz substrate, Mg:Ag was deposited without using a mask to form a second film having a film thickness of 15 nm. Deposition was conducted while Mg:Ag volume ratio was adjusted to be 1:10. The total deposition rate of Mg and Ag was 0.1 nm/sec.

Without forming resin film and first film, measurement of sheet resistance in evaluation 6 was conducted.

Ex. 25 corresponds to an Example of the present invention.

Figure 12:
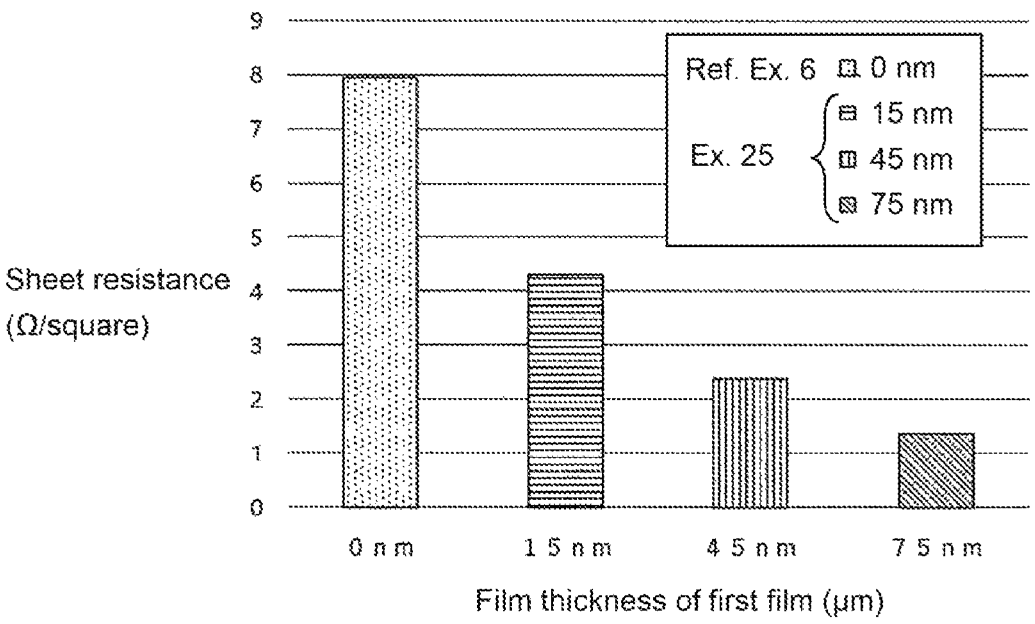
FIG. 12 is a graph illustrating the results in Examples.

The results of measurement of the sheet resistance are shown in FIG. 12.

As a result of evaluation, the sheet resistance in Ex. 25 was low as compared with Reference Example 6 in which no first film was formed. Further, it was confirmed that as the film thickness of the first film increases from 15 nm, 45 nm to 75 nm, the sheet resistance decreases.

From the above results, the present invention is confirmed to be useful.

This application is a continuation of PCT Application No. PCT/JP2021/023632, filed on Jun. 22, 2021, which is based upon and claims the benefit of priority from Japanese Patent Application No. 2020-112962 filed on Jun. 30, 2020. The contents of those applications are incorporated herein by reference in their entireties.

REFERENCE SYMBOLS

1, 2, 3, 11, 12: conductive film, 10, 13, 116: first film, 10A, 13A: first region, 10B, 13B: second region, 10X: conductive material, 15, 117: resin film, 20, 118: second film, 20*a*, 50*a*: surface, 50: substrate, 110: substrate, 111: anode, 115: cathode, P: fluorinated polymer, M: mask

What is claimed is:

1. A conductive film having a first region and a second region having a light transmittance higher than the first region, comprising:

a film comprising a conductive material; and a resin film comprising a fluorinated polymer and formed to overlap with the second region of the conductive film, wherein the fluorinated polymer of the resin film is at least one selected from the group consisting of a fluorinated polymer having an alicyclic structure in a main chain, a homopolymer of a fluoroolefin and a copolymer having units derived from tetrafluoroethylene and units derived from a perfluoroalkyl vinyl ether, wherein the fluorinated polymer satisfies that when a temperature is increased at a temperature-increasing rate of 2° C./min under a pressure of $1\times10^{-3}$ Pa, the temperature at which a thermogravimetric loss rate substantially reaches 100% is 400° C. or lower and a temperature width from the temperature at which the thermogravimetric loss rate is 10% to the temperature at which it is 90% is within 200° C.

2. The conductive film according to claim 1, further comprising:

a second film comprising a conductive material and extending from the first region to the second region, wherein the second film has a light transmittance higher than the film at a position overlapping with the first region, and the second film is in contact with the film at the first region.

3. The conductive film according to claim 1, wherein the resin film has a surface energy of 30 mN/m or less.

4. The conductive film according to claim 1, wherein the fluorinated polymer of the resin film has a melting point of 300° C. or lower.

5. The conductive film according to claim 1, wherein the fluorinated polymer of the resin film is amorphous.

6. The conductive film according to claim 1, wherein the fluorinated polymer of the resin film has a trifluoromethyl moiety in a content of 0.1 mmol/g or more in the fluorinated polymer.

7. An optoelectronic device, comprising:

the conductive film of claim 1.

8. The optoelectronic device according to claim 7, further comprising:

a substrate;

an anode formed on the substrate;

a cathode facing the anode; and an active layer formed between the anode and the cathode, wherein the cathode is the conductive film.

9. A method for producing a conductive film, comprising:

depositing a fluorinated polymer through a mask on a substrate such that a resin film comprising the fluorinated polymer is formed on the substrate; and forming a film comprising a conductive material such that the film is formed on a surface of a substrate, wherein the conductive film has a first region and a second region having a light transmittance higher than the first region, wherein the fluorinated polymer of the resin film is at least one selected from the group consisting of a fluorinated polymer having an alicyclic structure in a main chain, a homopolymer of a fluoroolefin and a copolymer having units derived from tetrafluoroethylene and units derived from a perfluoroalkyl vinyl ether, wherein the fluorinated polymer satisfies that when a temperature is increased at a temperature-increasing rate of 2° C./min under a pressure of $1\times10^{-3}$ Pa, the temperature at which a thermogravimetric loss rate substantially reaches 100% is 400° C. or lower and a temperature width from the temperature at which the thermogravimetric loss rate is 10% to the temperature at which it is 90% is within 200° C.

10. The method for producing a conductive film according to claim 9, further comprising:

removing the resin film after the dry coating.

11. The method for producing a conductive film according to claim 9, wherein the forming of the film includes forming the film comprising the conductive material on the surface of the substrate prior to the forming of the resin film or applying the conductive material on the resin film by dry coating.

12. The conductive film according to claim 2, wherein the resin film has a surface energy of 30 mN/m or less.

13. The conductive film according to claim 2, wherein the fluorinated polymer of the resin film has a melting point of 300° C. or lower.

14. The conductive film according to claim 2, wherein the fluorinated polymer of the resin film is amorphous.

15. The conductive film according to claim 2, wherein the fluorinated polymer of the resin film has a trifluoromethyl moiety in a content of 0.1 mmol/g or more in the fluorinated polymer.

16. The conductive film according to claim 1, wherein the main chain of the fluorinated polymer of the resin film has a terminal structure comprising at least one of a methyl ester group and a trifluoromethyl group.

17. The conductive film according to claim 2, wherein the main chain of the fluorinated polymer of the resin film has a terminal structure comprising at least one of a methyl ester group and a trifluoromethyl group.

18. The conductive film according to claim 1, wherein the film has the first region and the second region, and the resin film is formed in the second region of the film.

19. The conductive film according to claim 2, wherein the film has the first region and the second region, and the resin film is formed in the second region of the film.

* * * * *